US012801019B2

(12) United States Patent
Shibayama et al.

(10) Patent No.: US 12,801,019 B2
(45) Date of Patent: Nov. 17, 2026

(54) COMPOSITION FOR FORMING PHOTOCURABLE SILICON-CONTAINING COATING FILM

(71) Applicant: NISSAN CHEMICAL CORPORATION, Tokyo (JP)

(72) Inventors: Wataru Shibayama, Toyama (JP); Hikaru Tokunaga, Toyama (JP); Ken Ishibashi, Toyama (JP); Keisuke Hashimoto, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 898 days.

(21) Appl. No.: 18/077,276

(22) Filed: Dec. 8, 2022

(65) Prior Publication Data

US 2023/0112897 A1 Apr. 13, 2023

Related U.S. Application Data

(62) Division of application No. 16/955,617, filed as application No. PCT/JP2018/047068 on Dec. 20, 2018, now abandoned.

(30) Foreign Application Priority Data

Dec. 20, 2017 (JP) ................................ 2017-244357

(51) Int. Cl.

| | |
|---|---|
| ***G03F 7/075*** | (2006.01) |
| ***C08G 77/00*** | (2006.01) |
| ***C08G 77/04*** | (2006.01) |
| ***C08G 77/14*** | (2006.01) |
| ***C08G 77/18*** | (2006.01) |
| ***C08G 77/20*** | (2006.01) |
| ***C08G 77/26*** | (2006.01) |
| ***C08G 77/28*** | (2006.01) |
| ***C09D 183/04*** | (2006.01) |
| ***C09D 183/08*** | (2006.01) |
| ***G03F 7/09*** | (2006.01) |
| ***G03F 7/11*** | (2006.01) |
| ***G03F 7/16*** | (2006.01) |
| ***G03F 7/40*** | (2006.01) |

(52) U.S. Cl.

CPC ........... *G03F 7/0757* (2013.01); *C08G 77/04* (2013.01); *C08G 77/14* (2013.01); *C08G 77/18* (2013.01); *C08G 77/20* (2013.01); *C08G 77/26* (2013.01); *C08G 77/28* (2013.01); *C08G 77/80* (2013.01); *C09D 183/04* (2013.01); *C09D 183/08* (2013.01); *G03F 7/0755* (2013.01); *G03F 7/094* (2013.01); *G03F 7/11* (2013.01); *G03F 7/168* (2013.01); *G03F 7/40* (2013.01)

(58) Field of Classification Search

CPC .......... B32B 5/14; B32B 5/142; B32B 27/283

USPC ........................................ 106/287.15, 287.16

See application file for complete search history.

(56) References Cited

U.S. PATENT DOCUMENTS

| | | | | |
|---|---|---|---|---|
| 10,372,040 | B2 * | 8/2019 | Shibayama | C08L 83/06 |
| 10,845,703 | B2 * | 11/2020 | Nakajima | G03F 7/168 |
| 2004/0048196 | A1 | 3/2004 | Shao et al. | |
| 2006/0024980 | A1 | 2/2006 | Tsuchiya et al. | |
| 2009/0130594 | A1 | 5/2009 | Takei et al. | |
| 2009/0162782 | A1 | 6/2009 | Takei et al. | |
| 2010/0022092 | A1 | 1/2010 | Horiguchi et al. | |
| 2010/0330505 | A1 | 12/2010 | Nakajima et al. | |
| 2017/0322491 | A1 | 11/2017 | Shibayama et al. | |
| 2018/0086886 | A1 | 3/2018 | Sakamoto et al. | |
| 2018/0335698 | A1 | 11/2018 | Nakajima et al. | |
| 2019/0051518 | A1 * | 2/2019 | Shigaki | C09D 183/04 |

FOREIGN PATENT DOCUMENTS

| | | | |
|---|---|---|---|
| JP | 2000-144012 | A | 5/2000 |
| JP | 2001-214092 | A | 8/2001 |
| JP | 2004-533637 | A | 11/2004 |
| JP | 2006-041052 | A | 2/2006 |
| JP | 2007-291313 | A | 11/2007 |
| WO | 2006/115044 | A1 | 11/2006 |
| WO | 2007/066597 | A1 | 6/2007 |
| WO | 2008/047638 | A1 | 4/2008 |
| WO | 2009/008446 | A1 | 1/2009 |
| WO | 2009/069712 | A1 | 6/2009 |

(Continued)

OTHER PUBLICATIONS

Machine translation of JP 2017-220622 (no date).*
Machine translation of WO 2007/066597 (no date).*
Oct. 31, 2023 Office Action issued in Korean Patent Application No. 10-2020-7019803.
Feb. 19, 2019 Search Report issued in International Patent Application No. PCT/JP2018/047068.
Feb. 19, 2019 Written Opinion of the International Searching Authority issued in International Patent Application No. PCT/JP2018/047068.
Mar. 30, 2023 Office Action issued in Japanese Patent Application No. 2019-560572.

*Primary Examiner* — Marc S Zimmer
(74) *Attorney, Agent, or Firm* — Oliff PLC

(57) ABSTRACT

A method for producing a coated substrate includes applying a photocurable silicon-containing coating film-forming composition to an uneven substrate; and exposing the photocurable silicon-containing coating film-forming composition to light, wherein the photocurable silicon-containing coating film-forming composition comprises a hydrolyzable silane, a hydrolysate thereof, or a hydrolytic condensate thereof, wherein the hydrolyzable silane is a hydrolyzable silane of the following Formula (1):

$$R^1_aR^2_bSi(R^3)_{4-(a+b)} \quad \text{Formula (1)}$$

wherein $R^1$ is a functional group relating to photocrosslinking; $R^2$ is an alkyl group and is bonded to a silicon atom via an Si—C bond; $R^3$ is an alkoxy group, an acyloxy group, or a halogen group; a is an integer of 1; b is an integer of 0 to 2; and a+b is an integer of 1 to 3.

3 Claims, No Drawings

(56) References Cited

FOREIGN PATENT DOCUMENTS

| | | | | | |
|---|---|---|---|---|---|
| WO | 2009/104552 | A1 | | 8/2009 | |
| WO | WO-2011013630 | A1 | * | 2/2013 | |
| WO | WO-2013151187 | A1 | * | 10/2013 | ............. C08J 7/044 |
| WO | 2016/080226 | A1 | | 5/2016 | |
| WO | 2016/093172 | A1 | | 6/2016 | |
| WO | 2016/146896 | A1 | | 9/2016 | |
| WO | 2016/159358 | A1 | | 10/2016 | |

* cited by examiner

COMPOSITION FOR FORMING PHOTOCURABLE SILICON-CONTAINING COATING FILM

TECHNICAL FIELD

The present invention relates to an uneven substrate coating composition for forming a planarization film on an uneven substrate by photocrosslinking, and to a method for producing a laminated substrate that is planarized by using the uneven substrate coating composition.

BACKGROUND ART

In recent years, semiconductor integrated circuit devices have been processed with a fine design rule. Exposure light having a shorter wavelength must be used for formation of a finer resist pattern by an optical lithography technique.

However, the depth of focus decreases in association with the use of exposure light having a shorter wavelength, and thus the planarity of a coating film formed on a substrate must be improved. Thus, a technique for planarization of the film on the substrate has become important for the production of a semiconductor device having a fine design rule.

There has been disclosed a method for forming a planarization film (e.g., a resist underlayer film formed below a resist) by photocuring.

A resist underlayer film-forming composition has been disclosed which contains a polymer having an epoxy group or an oxetane group in a side chain and a photo-cationic polymerization initiator, or contains a polymer having a radical polymerizable ethylenically unsaturated bond and a photo-radical polymerization initiator (see Patent Document 1).

A resist underlayer film-forming composition has been disclosed which contains a silicon-containing compound having a cationic polymerizable reactive group (e.g., an epoxy group or a vinyl group), a photo-cationic polymerization initiator, and a photo-radical polymerization initiator (see Patent Document 2).

A method for producing a semiconductor device has been disclosed, in which the device includes a resist underlayer film containing a polymer having a crosslinkable functional group (e.g., a hydroxyl group) in a side chain, a crosslinking agent, and a photoacid generator (see Patent Document 3).

A resist underlayer film having an unsaturated bond in a main or side chain, which is not a photo-crosslinked resist underlayer film, has been disclosed (see Patent Documents 4 and 5).

PRIOR ART DOCUMENTS

Patent Documents

Patent Document 1: International Publication Pamphlet WO 2006/115044

Patent Document 2: International Publication Pamphlet WO 2007/066597

Patent Document 3: International Publication Pamphlet WO 2008/047638

Patent Document 4: International Publication Pamphlet WO 2009/008446

Patent Document 5: Japanese Unexamined Patent Application Publication (Translation of PCT Application) No. 2004-533637 (JP 2004-533637 A)

SUMMARY OF THE INVENTION

Problems to be Solved by the Invention

An object of the present invention is to provide a photocurable silicon-containing coating film-forming composition; in particular, a photocurable silicon-containing resist underlayer film-forming composition.

The planarization of an organic underlayer film on an uneven substrate is important for preventing the diffused reflection of exposure light in a resist layer from the layer interface and preventing occurrence of unevenness (occurrence of irregularities) after etching between an open area (non-patterned area) and a patterned area or between a DENCE patterned area and an ISO patterned area.

The organic underlayer film can be a photocurable organic underlayer film so as to prevent occurrence of voids in holes due to a reduction in fluidity during thermal curing, or to avoid deterioration of planarity.

In a multi-layer process, a silicon-containing resist underlayer film-forming composition is applied onto an organic underlayer film on a substrate; the composition is dried and baked; and the thus-formed silicon-containing resist underlayer film is coated with a resist film.

In the case where the silicon-containing resist underlayer film-forming composition applied onto the organic underlayer film is thermally baked for curing of the composition, the heat for baking may be transmitted to the organic underlayer film directly below the resist underlayer film, resulting in deterioration of the planarity of the organic underlayer film. This deterioration of the planarity of the organic underlayer film may be caused by shrinkage of the surface of the organic underlayer film by heat during curing of the silicon-containing resist underlayer film.

The present invention provides a photocurable silicon-containing resist underlayer film-forming composition. According to the present invention, since a silicon-containing resist underlayer film is photocured without the need for curing (baking) at high temperature in a lithographic process of an uneven substrate, the planarity of a photocured organic underlayer film present below the resist underlayer film is not deteriorated. Thus, formation of a resist film on the high-planarity silicon-containing resist underlayer film formed on the high-planarity organic underlayer film effectively prevents diffused reflection at the layer interface, and occurrence of unevenness after etching.

Means for Solving the Problems

A first aspect of the present invention is a photocurable silicon-containing coating film-forming composition comprising a hydrolyzable silane, a hydrolysate thereof, or a hydrolytic condensate thereof, wherein the hydrolyzable silane is a hydrolyzable silane of the following Formula (1):

$$R^1_aR^2_bSi(R^3)_{4-(a+b)} \quad \text{Formula (1)}$$

(wherein $R^1$ is an organic group (1) having a multiple bond between a carbon atom and a carbon atom, an oxygen atom, or a nitrogen atom, an epoxide-containing organic group (2), a sulfur-containing organic group (3), an organic group (4) containing an amide group, a primary to tertiary amino group, or a primary to tertiary ammonium group, a phenoplast-forming group (5) containing a phenolic-group-containing organic group or a phenolic-group-generating organic group and a methylol-group-containing organic group or a methylol-group-generating organic group, or an organic group containing any combination of these groups, and is bonded to a silicon atom via an Si—C bond; $R^2$ is an alkyl group and is bonded to a silicon atom via an Si—C bond; $R^3$ is an alkoxy group, an acyloxy group, or a halogen group; a is an integer of 1; b is an integer of 0 to 2; and a+b is an integer of 1 to 3).

A second aspect of the present invention is the photocurable silicon-containing coating film-forming composition according to the first aspect, wherein the hydrolyzable silane contains a hydrolyzable silane of Formula (1) and at least one hydrolyzable silane selected from the group consisting of a hydrolyzable silane of the following Formula (2):

$$R^4_cSi(R^5)_{4-c} \qquad \text{Formula (2)}$$

(wherein $R^4$ is an alkyl group or an aryl group and is bonded to a silicon atom via an Si—C bond; $R^5$ is an alkoxy group, an acyloxy group, or a halogen group; and c is an integer of 0 to 3) and a hydrolyzable silane of the following Formula (3):

$$[R^6_dSi(R^7)_{3-d}]_2Y_e \qquad \text{Formula (3)}$$

(wherein $R^6$ is an alkyl group or an aryl group and is bonded to a silicon atom via an Si—C bond; $R^7$ is an alkoxy group, an acyloxy group, or a halogen group; Y is an alkylene group or an arylene group; d is an integer of 0 or 1; and e is an integer of 0 or 1).

A third aspect of the present invention is the photocurable silicon-containing coating film-forming composition according to the first or second aspect, wherein the organic group (1) having a multiple bond between a carbon atom and a carbon atom is a vinyl group, a propargyl group, an allyl group, an acryloyl group, a methacryloyl group, a styryl group, a substituted phenyl group, a norbornene group, or an organic group containing any of these groups.

A fourth aspect of the present invention is the photocurable silicon-containing coating film-forming composition according to the first or second aspect, wherein the organic group (1) having a multiple bond between a carbon atom and an oxygen atom is a carbonyl group, an acyl group, or an organic group containing any of these groups.

A fifth aspect of the present invention is the photocurable silicon-containing coating film-forming composition according to the first or second aspect, wherein the organic group (1) having a multiple bond between a carbon atom and a nitrogen atom is a nitrile group, an isocyanate group, or an organic group containing any of these groups.

A sixth aspect of the present invention is the photocurable silicon-containing coating film-forming composition according to the first or second aspect, wherein the epoxide-containing organic group (2) is an epoxy group, a cyclohexylepoxy group, a glycidyl group, an oxetanyl group, or a dihydroxyalkyl group formed by ring opening of any of these groups, or an organic group containing any of these groups.

A seventh aspect of the present invention is the photocurable silicon-containing coating film-forming composition according to the first or second aspect, wherein the sulfur-containing organic group (3) is a thiol group, a sulfide group, a disulfide group, or an organic group containing any of these groups.

An eighth aspect of the present invention is the photocurable silicon-containing coating film-forming composition according to the first or second aspect, wherein the organic group (4) containing an amide group is a sulfonamide group, a carboxylic acid amide group, or an organic group containing any of these groups.

A ninth aspect of the present invention is the photocurable silicon-containing coating film-forming composition according to the first or second aspect, wherein the organic group (4) containing a primary to tertiary ammonium group is a group formed by bonding between an organic group containing a primary to tertiary amino group and an acid.

A tenth aspect of the present invention is the photocurable silicon-containing coating film-forming composition according to the first or second aspect, wherein the phenoplast-forming group (5) is an acetalized phenyl group, an alkoxybenzyl group, or an organic group containing any of these groups.

An eleventh aspect of the present invention is the photocurable silicon-containing coating film-forming composition according to any one of the first to tenth aspects, wherein the composition is a photocurable silicon-containing resist underlayer film-forming composition for forming a silicon-containing resist underlayer film that is cured by ultraviolet irradiation and serves as an intermediate layer between a resist film and an organic underlayer film on a substrate in a lithographic process for producing a semiconductor device.

A twelfth aspect of the present invention is a method for producing a coated substrate, the method comprising a step (i) of applying the photocurable silicon-containing coating film-forming composition according to any one of the first to eleventh aspects to an uneven substrate; and a step (ii) of exposing the photocurable silicon-containing coating film-forming composition to light.

A thirteenth aspect of the present invention is the method for producing a coated substrate according to the twelfth aspect, wherein the method further comprises a step (ia) of heating the photocurable silicon-containing coating film-forming composition at a temperature of 70 to 400° C. for 10 seconds to five minutes after application of the composition to the uneven substrate in the step (i).

A fourteenth aspect of the present invention is the method for producing a coated substrate according to the twelfth or thirteenth aspect, wherein light used for the light exposure in the step (ii) has a wavelength of 150 nm to 330 nm.

A fifteenth aspect of the present invention is the method for producing a coated substrate according to any one of the twelfth to fourteenth aspects, wherein the dose of exposure light in the step (ii) is 10 $mJ/cm^2$ to 3,000 $mJ/cm^2$.

A sixteenth aspect of the present invention is the method for producing a coated substrate according to any one of the twelfth to fifteenth aspects, wherein the light exposure in the step (ii) is performed in an inert gas atmosphere containing oxygen and/or water vapor.

A seventeenth aspect of the present invention is the method for producing a coated substrate according to any one of the twelfth to sixteenth aspects, wherein the substrate has an open area (non-patterned area) and a patterned area of DENSE (dense) and ISO (coarse), and the pattern has an aspect ratio of 0.1 to 10.

An eighteenth aspect of the present invention is the method for producing a coated substrate according to any one of the twelfth to seventeenth aspects, wherein the substrate has an open area (non-patterned area) and a patterned area of DENSE (dense) and ISO (coarse), and the difference in coating level (Bias) between the open area and the patterned area is 1 to 50 nm.

A nineteenth aspect of the present invention is a method for producing a semiconductor device, the method comprising a step of forming, on an uneven substrate, a resist underlayer film from the photocurable silicon-containing coating film-forming composition according to any one of the first to eleventh aspects; a step of forming a resist film on the resist underlayer film; a step of irradiating the resist film with light or electron beams and developing the resist film, to thereby form a resist pattern; a step of etching the resist underlayer film with the resist pattern; and a step of processing a semiconductor substrate with the patterned resist underlayer film.

A twentieth aspect of the present invention is the method for producing a semiconductor device according to the nineteenth aspect, wherein the uneven substrate is the substrate according to the seventeenth aspect.

A twenty-first aspect of the present invention is the method for producing a semiconductor device according to the nineteenth aspect, wherein the step of forming a resist underlayer film from the photocurable silicon-containing coating film-forming composition is a step of forming the resist underlayer film by the method according to any one of the twelfth to sixteenth aspects.

A twenty-second aspect of the present invention is the method for producing a semiconductor device according to the twenty-first aspect, wherein the uneven substrate is the substrate according to the seventeenth aspect.

A twenty-third aspect of the present invention is the method for producing a semiconductor device according to the nineteenth aspect, wherein the resist underlayer film formed from the photocurable silicon-containing coating film-forming composition has the difference in coating level according to the eighteenth aspect.

A twenty-fourth aspect of the present invention is a method for producing a semiconductor device, the method comprising a step of forming, on an uneven substrate, an organic underlayer film from a photocurable organic underlayer film-forming composition; a step of forming, on the organic underlayer film, a resist underlayer film from the photocurable silicon-containing coating film-forming composition according to any one of the first to eleventh aspects; a step of forming a resist film on the resist underlayer film; a step of irradiating the resist film with light or electron beams and developing the resist film, to thereby form a resist pattern; a step of etching the resist underlayer film with the resist pattern; a step of etching the organic underlayer film with the patterned resist underlayer film; and a step of processing a semiconductor substrate with the patterned organic underlayer film.

A twenty-fifth aspect of the present invention is the method for producing a semiconductor device according to the twenty-fourth aspect, wherein the step of forming a resist underlayer film from the photocurable silicon-containing coating film-forming composition is a step of forming the resist underlayer film by the method according to any one of the twelfth to sixteenth aspects.

A twenty-sixth aspect of the present invention is the method for producing a semiconductor device according to the twenty-fourth aspect, wherein the resist underlayer film formed from the photocurable silicon-containing coating film-forming composition has the difference in coating level according to the eighteenth aspect.

Effects of the Invention

Ultraviolet rays having a wavelength of 300 nm or less are called deep-ultraviolet rays, and ultraviolet rays having a wavelength of 200 nm or less are called far-ultraviolet rays. Far-ultraviolet rays have a photon energy higher than that of common UV light, and induce photochemical reactions that cannot be induced by UV light. Most of the photochemical reactions involve breakage and recombination of chemical bonds.

The relationships between typical chemical bond energies and corresponding light wavelengths are as follows: C—C bond: 353 kJ/mol (corresponding to a wavelength of 339 nm), C═C bond: 582 kJ/mol (corresponding to a wavelength of 206 nm), C—H bond: 410 kJ/mol (corresponding to a wavelength of 292 nm), C—O bond: 324 kJ/mol (corresponding to a wavelength of 369 nm), C═O bond: 628 kJ/mol (corresponding to a wavelength of 190 nm), O—H bond: 459 kJ/mol (corresponding to a wavelength of 261 nm), O═O bond: 494 kJ/mol (corresponding to a wavelength of 242 nm), and Si—O bond: 430 kJ/mol (corresponding to a wavelength of 278 nm).

In consideration of the difference in crystalline state or molecular structure between materials, the tendency of chemical bonds to break cannot be determined only by bond energies. However, the tendency of chemical bonds to break probably has some relations with decomposition reactions.

A silicon-containing coating film (in particular, a silicon-containing resist underlayer film) is photocured with a photoirradiation apparatus at 172 nm in an atmosphere of inert gas (in particular, nitrogen gas). The inert gas atmosphere may contain a trace amount of oxygen (about 10 ppm to 1,000 ppm, in particular, 100 ppm or thereabouts). In some cases, the atmosphere may contain water vapor (water) generated by, for example, dehydration condensation of silanol groups. Far-ultraviolet rays are readily absorbed by oxygen molecules or nitrogen molecules. Far-ultraviolet rays of 172 nm or less cause the dissociation of oxygen molecules into singlet oxygen atoms and triplet oxygen atoms. Singlet oxygen atoms are in a higher energy state (more highly active state) than triplet oxygen atoms, and thus can abstract hydrogen atoms from hydrocarbon molecules to thereby generate radicals.

Water vapor (water molecule) absorbs far-ultraviolet rays of 190 nm or less and dissociates into hydrogen radicals and hydroxyl radicals. Singlet oxygen atoms react with water molecules to generate bimolecular hydroxyl radicals.

Active oxygen species (e.g., atomic oxygen, ozone, or OH radical) oxidizes organic molecules to accelerate a chemical reaction. The crosslinking reaction of organic components proceeds through new radical generation by radicals, induction of polymerization of unsaturated bonds by radicals, or recombination of radicals. Silanol groups form siloxane bonds through decomposition and binding, resulting in progression of a crosslinking reaction.

A functional group moiety (carbonyl group, ether group, CN group, sulfonyl group, NH group, or NR group) of a material can dissociate to form radicals. Such radicals also contribute to a crosslinking reaction through new radical generation by hydrogen abstraction, induction of polymerization of unsaturated bonds, or recombination of radicals.

A saturated hydrocarbon moiety (having a carbon atom number of two or more), an unsaturated hydrocarbon moiety, or a cyclic unsaturated hydrocarbon moiety of a material oxidizes with active oxygen species, to thereby form a polar functional group (—OH group, —CHO group, or —COOH group) by the oxidation reaction. A crosslinking reaction also proceeds through reaction between such polar functional groups.

Thus, photoirradiation (far-ultraviolet irradiation at a wavelength of 150 nm to 330 nm, in particular, at 172 nm or thereabouts) causes a complicated photochemical reaction by a plurality of factors, resulting in formation of a crosslinked structure and curing of a coating film.

In the present invention, a polysiloxane material containing an organic side chain is cured by utilizing the aforementioned reaction (i.e., cured by photoreaction without application of heat), to thereby reduce thermal shrinkage of the surface of an organic underlayer film present below the thus-cured layer. Thus, since the planarity of the organic underlayer film (in particular, the organic underlayer film formed by photoirradiation) is not deteriorated, a fine rectangular pattern can be formed in a lithographic process, and a highly accurate semiconductor device can be produced by processing of a substrate with the resultant resist pattern.

MODES FOR CARRYING OUT THE INVENTION

The present invention is directed to a photocurable silicon-containing coating film-forming composition comprising a hydrolyzable silane, a hydrolysate thereof, or a hydrolytic condensate thereof, wherein the hydrolyzable silane is a hydrolyzable silane of the following Formula (1).

$$R^1_aR^2_bSi(R^3)_{4-(a+b)} \qquad \text{Formula (1)}$$

The photocurable silicon-containing coating film-forming composition is useful as a photocurable silicon-containing resist underlayer film-forming composition for forming a silicon-containing resist underlayer film that is cured by ultraviolet irradiation and serves as an intermediate layer between a resist film and an organic underlayer film on a substrate in a lithographic process for producing a semiconductor device.

In Formula (1), $R^1$ is an organic group (1) having a multiple bond between a carbon atom and a carbon atom, an oxygen atom, or a nitrogen atom, an epoxide-containing organic group (2), a sulfur-containing organic group (3), an organic group (4) containing an amide group, a primary to tertiary amino group, or a primary to tertiary ammonium group, a phenoplast-forming group (5) containing a phenolic-group-containing organic group or a phenolic-group-generating organic group and a methylol-group-containing organic group or a methylol-group-generating organic group, or an organic group containing any combination of these groups, and is bonded to a silicon atom via an Si—C bond; $R^2$ is an alkyl group and is bonded to a silicon atom via an Si—C bond; $R^3$ is an alkoxy group, an acyloxy group, or a halogen group; a is an integer of 1; b is an integer of 0 to 2; and a+b is an integer of 1 to 3.

Each of the organic groups (1) to (5) or any combination of these may be bonded to a silicon atom directly or via a linear or branched alkylene group having a carbon atom number of 1 to 10. The alkylene group may contain a hydroxyl group or a sulfonyl group.

The aforementioned hydrolyzable silane contains, besides a hydrolyzable silane of Formula (1), at least one hydrolyzable silane selected from the group consisting of hydrolyzable silanes of the following Formulae (2) and (3).

$$R^4_cSi(R^5)_{4-c} \qquad \text{Formula (2)}$$

$$[R^6_dSi(R^7)_{3-d}]_2Y_e \qquad \text{Formula (3)}$$

In Formula (2), $R^4$ is an alkyl group or an aryl group and is bonded to a silicon atom via an Si—C bond; $R^5$ is an alkoxy group, an acyloxy group, or a halogen group; and c is an integer of 0 to 3.

In Formula (3), $R^6$ is an alkyl group or an aryl group and is bonded to a silicon atom via an Si—C bond; $R^7$ is an alkoxy group, an acyloxy group, or a halogen group; Y is an alkylene group or an arylene group; d is an integer of 0 or 1; and e is an integer of 0 or 1.

The entire hydrolyzable silane may contain a hydrolyzable silane of Formula (1) in an amount of 5 to 90% by mole or 10 to 85% by mole.

The coating film-forming composition of the present invention contains the aforementioned hydrolytic condensate and a solvent. The composition may contain, as optional components, an acid, water, an alcohol, a curing catalyst, an acid generator, another organic polymer, a light-absorbing compound, and a surfactant.

The coating film-forming composition of the present invention has a solid content of, for example, 0.1 to 50% by mass, or 0.1 to 30% by mass, or 0.1 to 25% by mass. The term "solid content" as used herein corresponds to the amount of all components of the coating film-forming composition, except for the amount of a solvent component.

The hydrolyzable silane, a hydrolysate thereof, and a hydrolytic condensate thereof account for 20% by mass or more (e.g., 50 to 100% by mass, 60 to 99% by mass, or 70 to 99% by mass) of the solid content.

The aforementioned hydrolytic condensate may be in the form of a mixture of the hydrolyzable silane, the hydrolysate, the hydrolytic condensate, and an incomplete hydrolysis product (i.e., a partial hydrolysate) obtained during preparation of the hydrolytic condensate. The mixture may be used in the composition. The condensate is a polymer having a polysiloxane structure.

The aforementioned hydrolyzable silane may be a hydrolyzable silane of Formula (1).

In Formula (1), the organic group (1) having a multiple bond between a carbon atom and a carbon atom may be a vinyl group, a propargyl group, an allyl group, an acryloyl group, a methacryloyl group, a styryl group, a substituted phenyl group, a norbornene group, or an organic group containing any of these groups. The allyl group may serve as a substituent on a nitrogen atom of a triazine-trione ring to form a diallyl isocyanurate ring.

In Formula (1), the organic group (1) having a multiple bond between a carbon atom and an oxygen atom may be a carbonyl group, an acyl group, or an organic group containing any of these groups. The carbonyl group may form a formyl group or an ester bond.

In Formula (1), the organic group (1) having a multiple bond between a carbon atom and a nitrogen atom may be a nitrile group, an isocyanate group, or an organic group containing any of these groups.

In Formula (1), the epoxide-containing organic group (2) may be an epoxy group, a cyclohexylepoxy group, a glycidyl group, an oxetanyl group, or a dihydroxyalkyl group formed by ring opening of any of these groups, or an organic group containing any of these groups. When the aforementioned epoxide is reacted with an aqueous inorganic acid solution (e.g., an aqueous nitric acid solution), a dihydroxyalkyl group is formed by the ring-opening reaction of an epoxy group. The ring-opened moiety of a cyclohexylepoxy group or an epoxyglycidyl group is transformed into a dihydroxyethyl group, and the ring-opened moiety of an oxetanyl group is transformed into a dihydroxypropyl group.

In Formula (1), the sulfur-containing organic group (3) may be a thiol group, a sulfide group, a disulfide group, or an organic group containing any of these groups.

In Formula (1), the organic group (4) containing an amide group may be a sulfonamide group, a carboxylic acid amide group, or an organic group containing any of these groups.

In Formula (1), the organic group (4) containing an amino group may be a primary amino group, a secondary amino group, a tertiary amino group, or an organic group containing any of these groups. Such an amino group may be reacted with an inorganic acid or an organic acid, to thereby form a primary ammonium salt, a secondary ammonium salt, a tertiary ammonium salt, or an organic group containing any of these salts.

In Formula (1), the phenoplast-forming group (5) may be an acetalized phenyl group, an alkoxybenzyl group, or an organic group containing any of these groups.

The acetal group is readily eliminated with an acid to form a hydroxyl group, resulting in generation of phenol. The alkoxybenzyl group is readily dissociated with an acid to form a benzyl cation, and the benzyl cation reacts with phenol at the ortho position or the para position to form a novolac bond, resulting in crosslinking. Far-ultraviolet irradiation can induce such a reaction.

The aforementioned alkyl group is a linear or branched alkyl group having a carbon atom number of 1 to 10. Examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The alkyl group may be a cyclic alkyl group. Examples of cyclic alkyl groups having a carbon atom number of 1 to 10 include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group. A bicyclo group may be used.

The aryl group is a $C_{10-40}$ aryl group, and examples thereof include phenyl group, naphthyl group, anthryl group, and pyrene group.

The alkoxyalkyl group is an alkyl group substituted with an alkoxy group. Examples of the alkoxyalkyl group include methoxymethyl group, ethoxymethyl group, ethoxyethyl group, and ethoxymethyl group.

The aforementioned $C_{1-20}$ alkoxy group is, for example, an alkoxy group having a linear, branched, or cyclic alkyl moiety having a carbon atom number of 1 to 20. Examples of the alkoxy group include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Examples of the aforementioned $C_{2-20}$ acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the aforementioned halogen group include fluoro group, chloro group, bromo group, and iodo group.

Examples of the hydrolyzable silane of Formula (1) are as follows.

Formula (1-1-1)

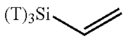

-continued
Formula (1-1-2)
Formula (1-1-3)
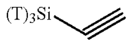
Formula (1-1-4)
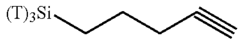
Formula (1-1-5)
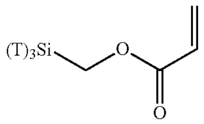
Formula (1-1-6)
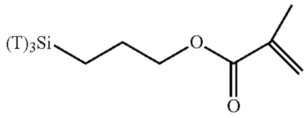
Formula (1-1-7)
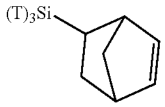
Formula (1-1-8)
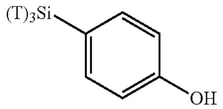
Formula (1-1-9)
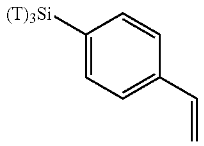
Formula (1-2-1)
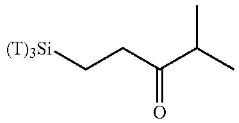
Formula (1-2-2)
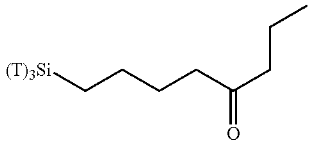
Formula (1-2-3)
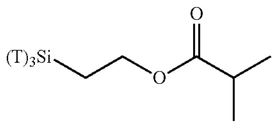
Formula (1-2-4)
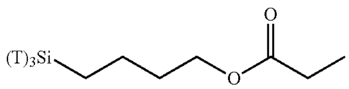
Formula (1-2-5)
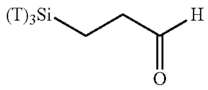
Formula (1-2-6)
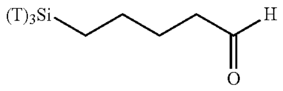
Formula (1-3-1)
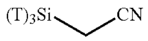
-continued
Formula (1-3-2)
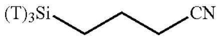
Formula (1-3-3)
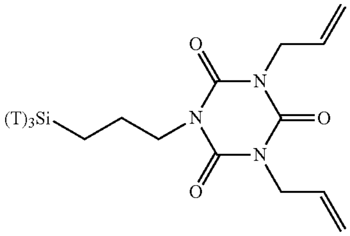
Formula (1-3-4)
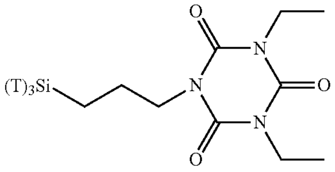
Formula (1-3-5)
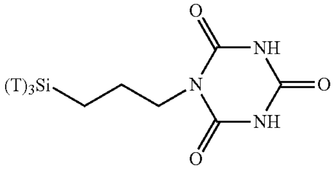
Formula (1-4-1)
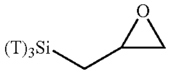
Formula (1-4-2)
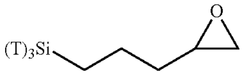
Formula (1-4-3)
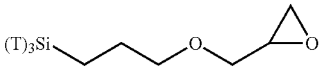
Formula (1-4-4)
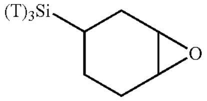
Formula (1-4-5)
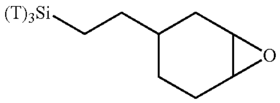
Formula (1-4-6)
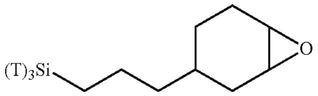
Formula (1-4-7)
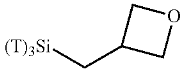
Formula (1-4-8)
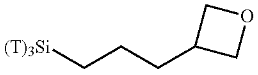
Formula (1-4-9)
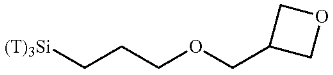
Formula (1-5-1)
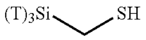

-continued

Formula (1-5-2)

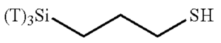

Formula (1-5-3)

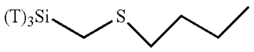

Formula (1-5-4)

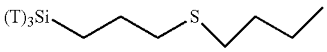

Formula (1-5-5)

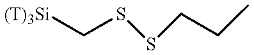

Formula (1-5-6)

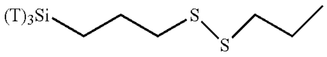

Formula (1-6-1)

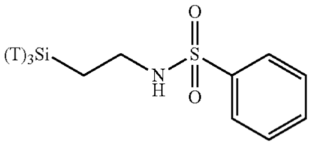

Formula (1-6-2)

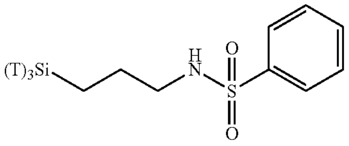

Formula (1-6-3)

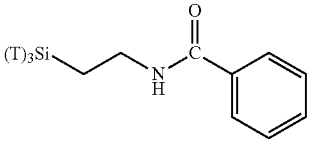

Formula (1-6-4)

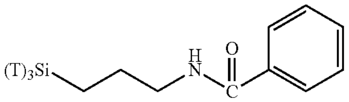

Formula (1-7-1)

Formula (1-7-2)

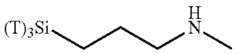

Formula (1-7-3)

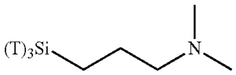

Formula (1-7-4)

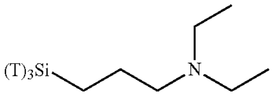

Formula (1-7-5)

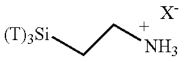

Formula (1-7-6)

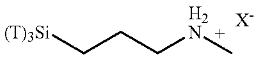

Formula (1-7-7)

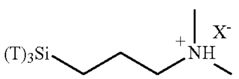

Formula (1-7-8)

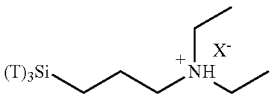

-continued

Formula (1-8-1)

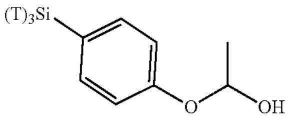

Formula (1-8-2)

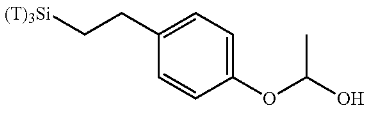

Formula (1-8-3)

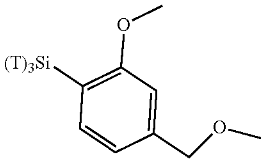

Formula (1-8-4)

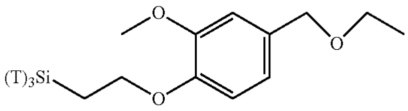

In the aforementioned formulae, T corresponds to $R^3$ in Formula (1). In the present invention, the hydrolyzable silane may be a combination of a hydrolyzable silane of Formula (1) and an additional hydrolyzable silane. The additional hydrolyzable silane may be at least one selected from the group consisting of hydrolyzable silanes of Formulae (2) and (3).

When a hydrolyzable silane of Formula (1) is used in combination with an additional hydrolyzable silane, the entire hydrolyzable silane may contain the hydrolyzable silane of Formula (1) in an amount of 10 to 90% by mole, or 15 to 85% by mole, or 20 to 80% by mole, or 20 to 60% by mole.

In Formula (2), $R^4$ is an alkyl group and is bonded to a silicon atom via an Si—C bond; $R^5$ is an alkoxy group, an acyloxy group, or a halogen group; and c is an integer of 0 to 3. Examples of the alkyl group, the alkoxy group, the acyloxy group, and the halogen group include those exemplified above.

In Formula (3), $R^6$ is an alkyl group and is bonded to a silicon atom via an Si—C bond; $R^7$ is an alkoxy group, an acyloxy group, or a halogen group; Y is an alkylene group or an arylene group; d is an integer of 0 or 1; and e is an integer of 0 or 1. Examples of the alkyl group, the alkoxy group, the acyloxy group, and the halogen group include those exemplified above.

Specific examples of the hydrolyzable silane of Formula (2) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltriacetixysilane, methyltributoxysilane, methyltripropoxysilane, methyltriamyloxysilane, methyltriphenoxysilane, methyltribenzyloxysilane, methyltriphenethyloxysilane, ethyltrimethoxysilane, and ethyltriethoxysilane.

Specific examples of the hydrolyzable silane of Formula (3) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.
Examples of the hydrolytic condensate used in the present invention are as follows.
Formula (A-1)
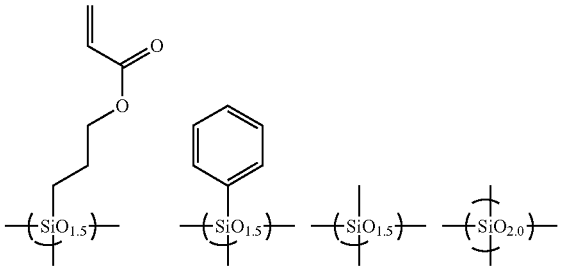
Formula (A-2)
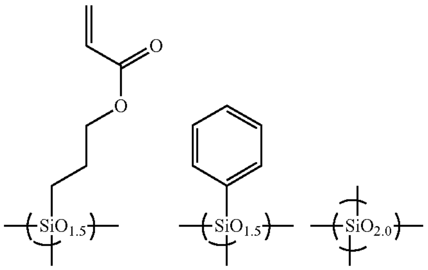
Formula (A-3)
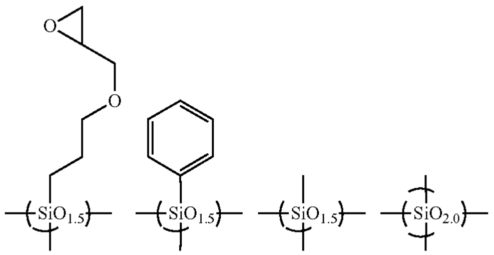
Formula (A-4)
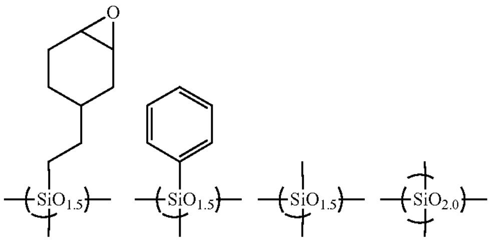
Formula (A-5)
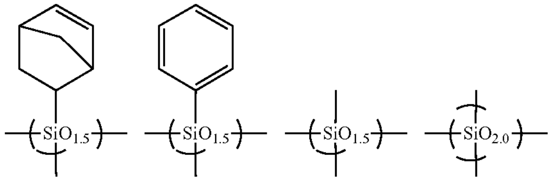
Formula (A-6)
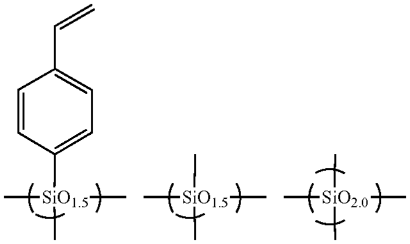
Formula (A-7)
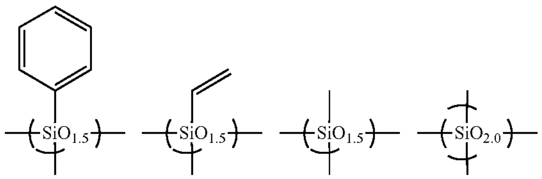
Formula (A-8)
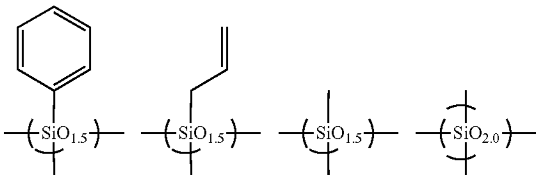
Formula (A-9)
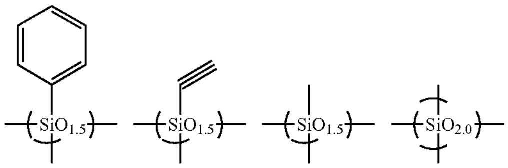
Formula (A-10)
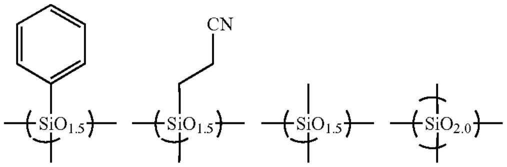

-continued
Formula (A-11)
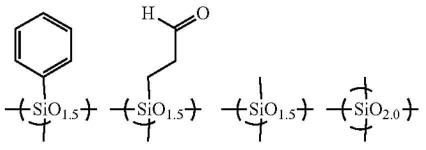
Formula (A-12)
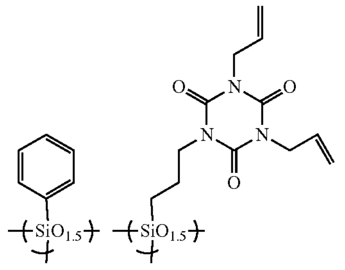
Formula (A-13)
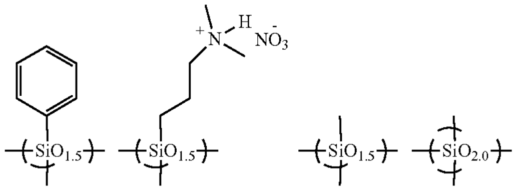
Formula (A-14)
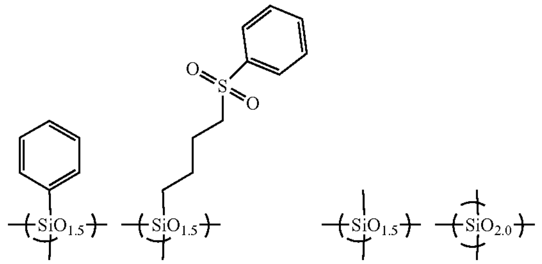
Formula (A-15)
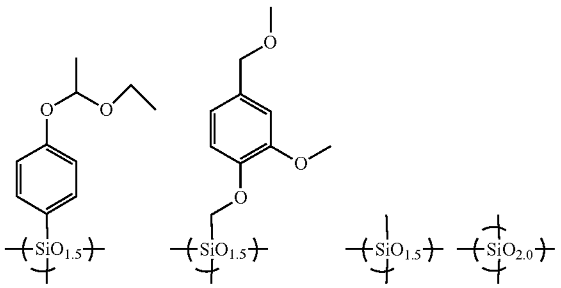
Formula (A-16)
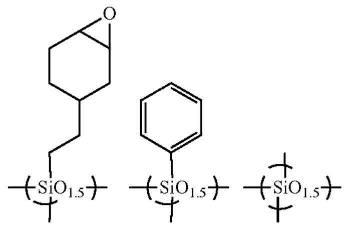
Formula (A-17)
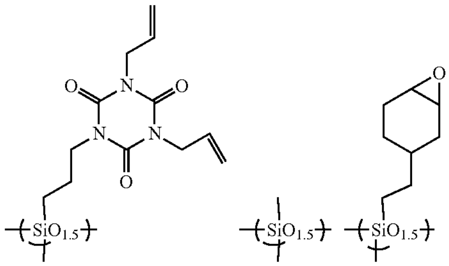
Formula (A-18)
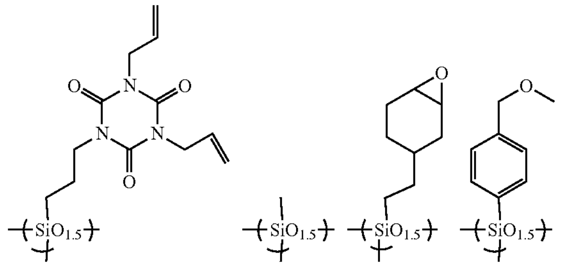
Formula (A-19)
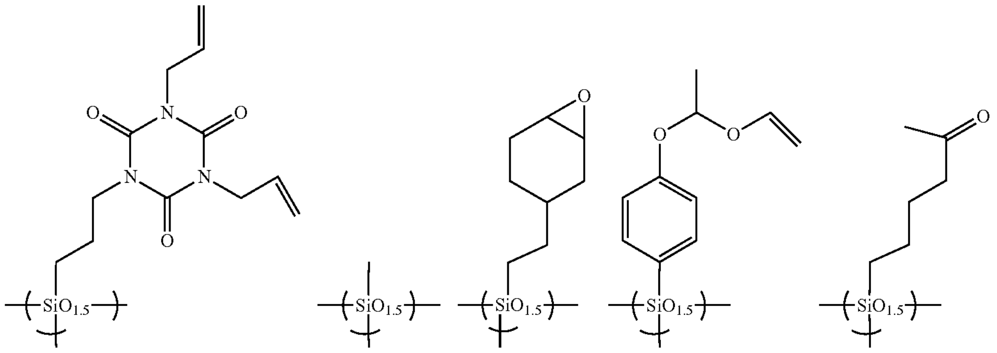

The hydrolytic condensate (polyorganosiloxane) of the aforementioned hydrolyzable silane may have a weight average molecular weight of 1,000 to 1,000,000 or 1,000 to 100,000. The molecular weight is determined by GPC analysis in terms of polystyrene.

The GPC analysis can be performed under, for example, the following conditions: GPC apparatus (trade name: HLC-8220GPC, available from Tosoh Corporation), GPC columns (trade name: Shodex KF803L, KF802, and KF801, available from Showa Denko K.K.), a column temperature of 40° C., tetrahydrofuran serving as an eluent (elution solvent), a flow amount (flow rate) of 1.0 ml/min, and polystyrene (available from Showa Denko K.K.) as a standard sample.

For the hydrolysis of an alkoxysilyl group, an acyloxysilyl group, or a halogenated silyl group, 0.5 to 100 mol (preferably 1 to 10 mol) of water is used per mol of the hydrolyzable group.

Furthermore, 0.001 to 10 mol (preferably 0.001 to 1 mol) of a hydrolysis catalyst may be used per mol of the hydrolyzable group.

The reaction temperature for hydrolysis and condensation is generally 20 to 80° C.

The hydrolysis may be completely or partially performed. Thus, a hydrolysate or a monomer may remain in the resultant hydrolytic condensate.

A catalyst may be used for the hydrolysis and condensation.

Examples of the hydrolysis catalyst include a metal chelate compound, an organic acid, an inorganic acid, an organic base, and an inorganic base.

Examples of the metal chelate compound serving as a hydrolysis catalyst include titanium chelate compounds, such as triethoxy mono(acetylacetonato)titanium; zirconium chelate compounds, such as triethoxy mono(acetylacetonato)zirconium; and aluminum chelate compounds, such as tris(acetylacetonato)aluminum.

Examples of the organic acid serving as a hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid serving as a hydrolysis catalyst include hydrochloric acid, nitric acid, sulfuric acid, hydrofluoric acid, and phosphoric acid.

Examples of the organic base serving as a hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide.

Examples of the inorganic base include ammonia, sodium hydroxide, potassium hydroxide, barium hydroxide, and calcium hydroxide. Among these catalysts, a metal chelate compound, an organic acid, and an inorganic acid are preferred. These catalysts may be used alone or in combination of two or more species.

Examples of the organic solvent used for the hydrolysis include aliphatic hydrocarbon solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more species.

Particularly preferred are ketone solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, and acetophenone, in view of the preservation stability of the resultant solution.

From a hydrolytic condensate (polymer) prepared by hydrolysis and condensation of a hydrolyzable silane with a catalyst in a solvent, alcohols (i.e., by-products), the used hydrolysis catalyst, and water can be simultaneously removed by, for example, distillation under reduced pressure. Furthermore, an acid or base catalyst used in the hydrolysis can be removed by neutralization or ion exchange. In the case of the coating film-forming composition (in particular, the resist underlayer film-forming composition for lithography) of the present invention, an organic acid, water, an alcohol, or any combination of these may be added to the coating film-forming composition (resist underlayer film-forming composition) containing the hydrolytic condensate for stabilization of the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, salicylic acid, p-toluenesulfonic acid, trifluoromethanesulfonic acid, pyridinium p-toluenesulfonate, salicylic acid, sulfosalicylic acid, citric acid, benzoic acid, hydroxybenzoic acid, and naphthalenecarboxylic acid. Of these, oxalic acid, maleic acid, etc. are preferred. The amount of the organic acid added is 0.1 to 5.0 parts by mass relative to 100 parts by mass of the condensate (polyorganosiloxane). For example, pure water, ultrapure water, or ion-exchange water may be added to the composition, and the amount of the water added may be 1 to 20 parts by mass relative to 100 parts by mass of the coating film-forming composition (resist underlayer film-forming composition).

The alcohol added to the composition is preferably an alcohol that easily dissipates by heating after the application of the composition. Examples of the alcohol include methanol, ethanol, propanol, isopropanol, and butanol. The amount of the alcohol added may be 1 to 20 parts by mass relative to 100 parts by mass of the coating film-forming composition (resist underlayer film-forming composition).

In the present invention, thermal crosslinking can be performed at a low temperature (e.g., about 100° C. to 170° C.) during predrying in combination with photocrosslinking, to thereby completely cure the photocurable resist underlayer film.

The curing catalyst may be an ammonium salt, a phosphine, a phosphonium salt, or a sulfonium salt.

Examples of the ammonium salt include:

a quaternary ammonium salt having a structure of the following Formula (D-1):

Formula (D-1)

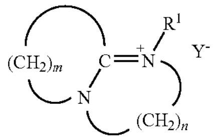

(wherein m is an integer of 2 to 11; n is an integer of 2 or 3; $R^1$ is an alkyl group or an aryl group; and $Y^-$ is an anion);

a quaternary ammonium salt having a structure of the following Formula (D-2):

$R^2R^3R^4R^5N^+Y^-$ Formula (D-2)

(wherein $R^2$, $R^3$, $R^4$, and $R^5$ are each an alkyl group or an aryl group; N is a nitrogen atom; $Y^-$ is an anion; and each of $R^2$, $R^3$, $R^4$, and $R^5$ is bonded to a nitrogen atom via a C—N bond);

a quaternary ammonium salt having a structure of the following Formula (D-3):

Formula (D-3)

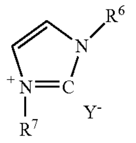

(wherein $R^6$ and $R^7$ are each an alkyl group or an aryl group; and $Y^-$ is an anion);

a quaternary ammonium salt having a structure of the following Formula (D-4):

Formula (D-4)

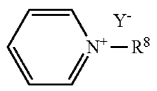

(wherein $R^8$ is an alkyl group or an aryl group; and $Y^-$ is an anion);

a quaternary ammonium salt having a structure of the following Formula (D-5):

Formula (D-5)

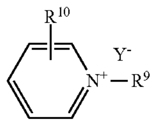

(wherein $R^9$ and $R^{10}$ are each an alkyl group or an aryl group; and $Y^-$ is an anion); and a tertiary ammonium salt having a structure of the following Formula (D-6):

Formula (D-6)

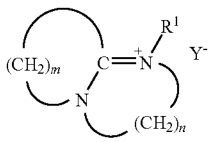

(wherein m is an integer of 2 to 11; n is an integer of 2 or 3; H is a hydrogen atom; and $Y^-$ is an anion).

Examples of the phosphonium salt include a quaternary phosphonium salt of the following Formula (D-7):

$$R^{11}R^{12}R^{13}R^{14}P^+Y^- \quad \text{Formula (D-7)}$$

(wherein $R^{11}$, $R^{12}$, $R^{13}$, and $R^{14}$ are each an alkyl group or an aryl group; P is a phosphorus atom; $Y^-$ is an anion; and each of $R^{11}$, $R^{12}$, $R^{13}$, and $R^{14}$ is bonded to a phosphorus atom via a C—P bond).

Examples of the sulfonium salt include a tertiary sulfonium salt of the following Formula (D-8):

$$R^{15}R^{16}R^{17}S^+Y^- \quad \text{Formula (D-8)}$$

(wherein $R^{15}$, $R^{16}$, and $R'^7$ are each an alkyl group or an aryl group; S is a sulfur atom; $Y^-$ is an anion; and each of $R^{15}$, $R^{16}$, and $R^{17}$ is bonded to a sulfur atom via a C—S bond).

The compound of Formula (D-1) is a quaternary ammonium salt derived from an amine. In Formula (D-1), m is an integer of 2 to 11, and n is an integer of 2 or 3. $R^1$ of the quaternary ammonium salt is a $C_{1-18}$ alkyl or aryl group, preferably a $C_{2-10}$ alkyl or aryl group. Examples of $R^1$ include linear alkyl groups, such as ethyl group, propyl group, and butyl group, benzyl group, cyclohexyl group, cyclohexylmethyl group, and dicyclopentadienyl group. Examples of the anion ($Y^-$) include halogen ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$).

The compound of Formula (D-2) is a quaternary ammonium salt having a structure of $R^2R^3R^4R^5N^+Y^-$. $R^2$, $R^3$, $R^4$, and $R^5$ of the quaternary ammonium salt are each a $C_{1-18}$ alkyl or aryl group, or a silane compound bonded to a silicon atom via an Si—C bond. Examples of the anion ($Y^-$) include halogen ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). The quaternary ammonium salt is commercially available, and examples of the quaternary ammonium salt include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. In Formula (D-3), $R^6$ and $R^7$ each have a carbon atom number of 1 to 18, and the total number of carbon atoms of $R^6$ and $R^7$ is preferably 7 or more. Examples of $R^6$ include methyl group, ethyl group, propyl group, phenyl group, and benzyl group. Examples of $R^7$ include benzyl group, octyl group, and octadecyl group. Examples of the anion ($Y^-$) include halogen ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). Although this compound is commercially available, the compound can be produced through, for example, reaction between an imidazole compound (e.g., 1-methylimidazole or 1-benzylimidazole) and an alkyl or aryl halide (e.g., benzyl bromide or methyl bromide).

The compound of Formula (D-4) is a quaternary ammonium salt derived from pyridine. In Formula (D-4), $R^8$ is a $C_{1-18}$ alkyl or aryl group, preferably a $C_{4-18}$ alkyl or aryl group. Examples of $R^8$ include butyl group, octyl group, benzyl group, and lauryl group. Examples of the anion ($Y^-$) include halogen ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). Although this compound is commercially available, the compound can be produced through, for example, reaction between pyridine and an alkyl or aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) is a quaternary ammonium salt derived from a substituted pyridine, such as picoline. In Formula (D-5), $R^9$ is a $C_{1-18}$ alkyl or aryl group, preferably a $C_{4-18}$ alkyl or aryl group. Examples of $R^9$ include methyl group, octyl group, lauryl group, and benzyl group. $R^{10}$ is a $C_{1-18}$ alkyl or aryl group, and, for example, $R^{10}$ is a methyl group when the compound is a quaternary ammonium salt derived from picoline. Examples of the anion ($Y^-$) include halogen ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). Although this compound is commercially available, the compound can be produced through, for example, reaction between a substituted pyridine (e.g., picoline) and an alkyl or aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine. In Formula (D-6), m is an integer of 2 to 11, and n is an integer of 2 or 3. Examples of the anion ($Y^-$) include halogen ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). The compound can be produced through, for example, reaction between an amine and a weak acid, such as a carboxylic acid or phenol. Examples of the carboxylic acid include formic acid and acetic acid. When formic acid is used, the anion ($Y^-$) is ($HCOO^-$). When acetic acid is used, the anion ($Y^-$) is ($CH_3COO^-$). When phenol is used, the anion ($Y^-$) is ($C_6H_5O^-$).

The compound of Formula (D-7) is a quaternary phosphonium salt having a structure of $R^{11}R^{12}R^{13}R^{14}P^+Y^-$. $R^{11}$, $R^{12}$, $R^{13}$, and $R^{14}$ are each a $C_{1-18}$ alkyl or aryl group, or a silane compound bonded to a silicon atom via an Si—C bond. Three of the four substituents $R^{11}$ to $R^{14}$ are preferably a phenyl group or a substituted phenyl group, such as a phenyl group or a tolyl group. The remaining one substituent is a $C_{1-18}$ alkyl or aryl group, or a silane compound bonded to a silicon atom via an Si—C bond. Examples of the anion ($Y^-$) include halogen ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). This compound is commercially available, and examples of the compound include tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; and tritolylmonoalkylphosphonium halides (wherein the halogen atom is a chlorine atom or a bromine atom). Particularly preferred are triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (wherein the halogen atom is a chlorine atom or a bromine atom).

Examples of the phosphine include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) is a tertiary sulfonium salt having a structure of $R^{15}R^{16}R^{17}S^{+}Y^{-}$. $R^{15}$, $R^{16}$, and $R^{17}$ are each a $C_{1-18}$ alkyl or aryl group, or a silane compound bonded to a silicon atom via an Si—C bond. Three of the four substituents $R^{15}$ to $R^{17}$ are preferably a phenyl group or a substituted phenyl group, such as a phenyl group or a tolyl group. The remaining one substituent is a $C_{1-18}$ alkyl or aryl group. Examples of the anion ($Y^-$) include halogen ions, such as chlorine ion ($Cl^-$), bromine ion ($Br^-$), and iodine ion ($I^-$); and acid groups, such as carboxylate ($—COO^-$), sulfonate ($—SO_3^-$), and alcoholate ($—O^-$). This compound is commercially available, and examples of the compound include tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; triphenylsulfonium halides (wherein the halogen atom is a chlorine atom or a bromine atom); tetraalkylphosphonium carboxylates, such as tri-n-butylsulfonium carboxylate and tri-n-propylsulfonium carboxylate; trialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate. Triphenylsulfonium halides and triphenylsulfonium carboxylate are preferably used.

The amount of the curing catalyst is 0.01 to 10 parts by mass, or 0.01 to 5 parts by mass, or 0.01 to 3 parts by mass relative to 100 parts by mass of the polyorganosiloxane.

The coating film-forming composition (resist underlayer film-forming composition) of the present invention may contain a crosslinking agent component. The crosslinking agent is, for example, a melamine compound, a substituted urea compound, or a polymer thereof. The crosslinking agent is preferably a crosslinking agent having at least two crosslinkable substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensate of such a compound may also be used.

The aforementioned crosslinking agent may be a crosslinking agent having high thermal resistance. The crosslinking agent having high thermal resistance is preferably a compound containing a crosslinkable substituent having an aromatic ring (e.g., a benzene ring or a naphthalene ring) in the molecule.

Examples of the compound include a compound having a partial structure of the following Formula (4) and a polymer or an oligomer having a repeating unit of the following Formula (5).

In Formula (4), $R^3$ and $R^4$ are each a hydrogen atom, a $C_{1-10}$ alkyl group, or a $C_{6-20}$ aryl group; n1 is an integer of 1 to 4; n2 is an integer of 1 to (5−n1); and (n1+n2) is an integer of 2 to 5.

In Formula (5), $R^5$ is a hydrogen atom or a $C_{1-10}$ alkyl group; $R^6$ is a $C_{1-10}$ alkyl group; n3 is an integer of 1 to 4; n4 is 0 to (4−n3); and (n3+n4) is an integer of 1 to 4. The oligomer and the polymer may have 2 to 100 repeating units or 2 to 50 repeating units.

Examples of these alkyl group and aryl group include alkyl groups and aryl groups exemplified above.

Formula (4)

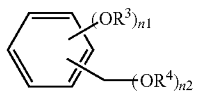

Formula (5)

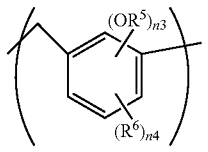

Examples of the compound of Formula (4) and the polymer or the oligomer of Formula (5) are as follows.

Formula (4-1)

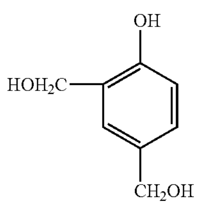

Formula (4-2)

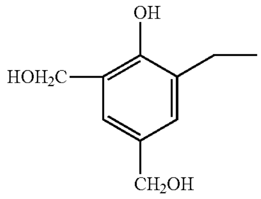

Formula (4-3)
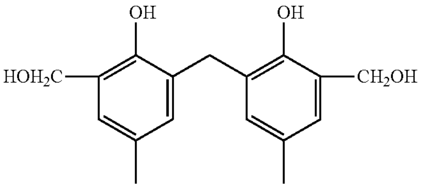
Formula (4-4)
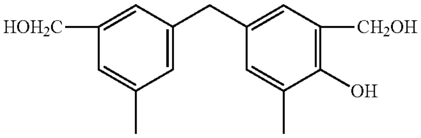
Formula (4-5)
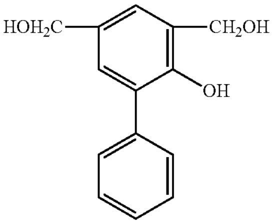
Formula (4-6)
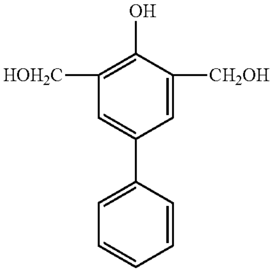
Formula (4-7)
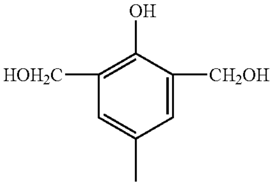
Formula (4-8)
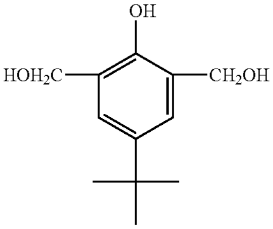
Formula (4-9)
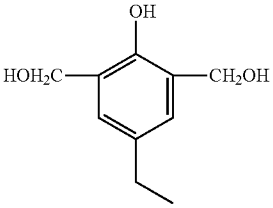
Formula (4-10)
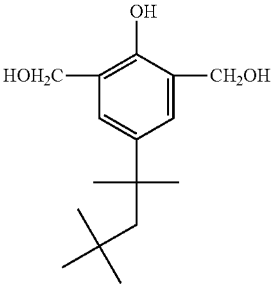
Formula (4-11)
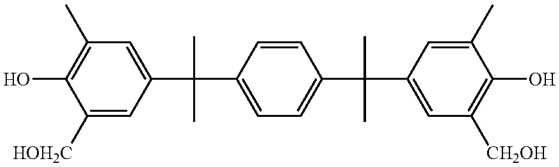
Formula (4-12)
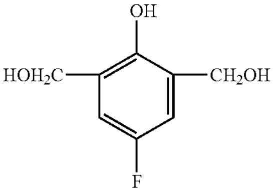
Formula (4-13)
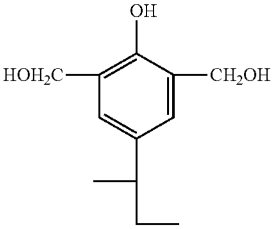
Formula (4-14)
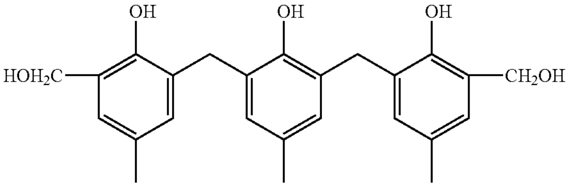
Formula (4-15)
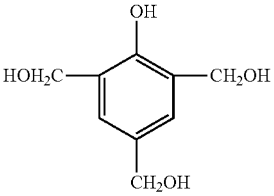
Formula (4-16)
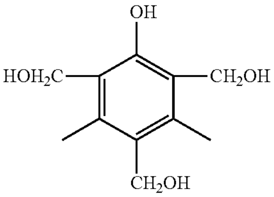

-continued

Formula (4-17)

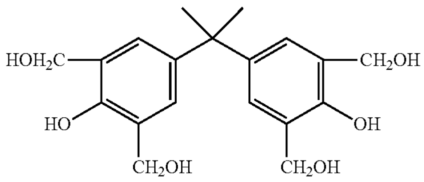

Formula (4-18)

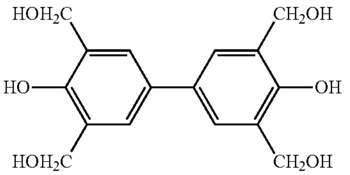

Formula (4-19)

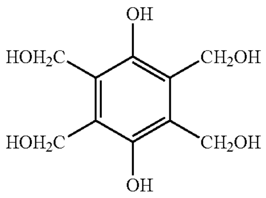

Formula (4-20)

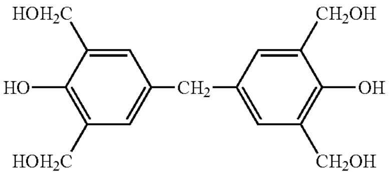

Formula (4-21)

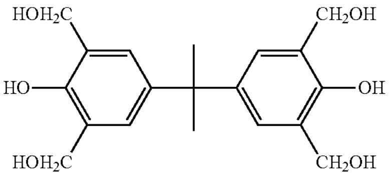

Formula (4-22)

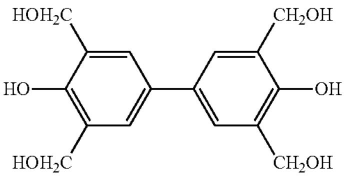

Formula (4-23)

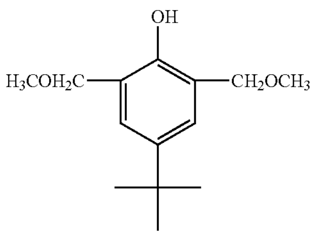

-continued

Formula (2-24)

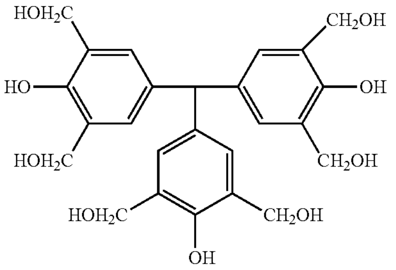

Formula (4-25)

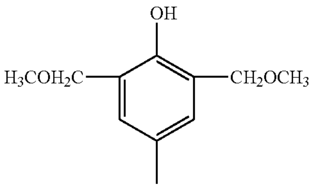

Formula (4-26)

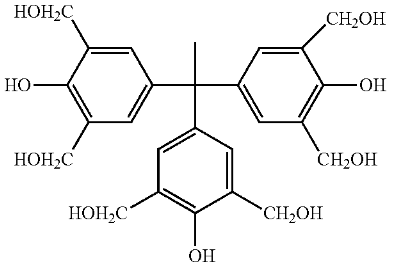

Formula (4-27)

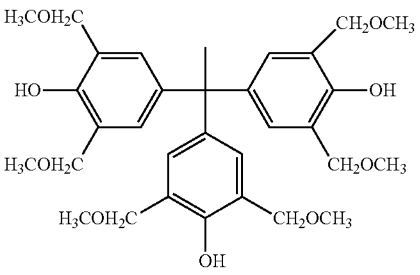

The aforementioned compounds can be obtained as products available from ASAHI YUKIZAI CORPORATION and Honshu Chemical Industry Co., Ltd. For example, among the aforementioned crosslinking agents, the compound of Formula (4-21) can be obtained as trade name TM-BIP-A available from ASAHI YUKIZAI CORPORATION.

The compound of Formula (4-22) can be obtained as trade name TMOM-BP available from Honshu Chemical Industry Co., Ltd.

The amount of the crosslinking agent added may vary depending on, for example, the type of a coating solvent used, the type of an underlying substrate used, the viscosity of a solution required, or the shape of a film required. The amount of the crosslinking agent is 0.001 to 80% by mass, preferably 0.01 to 50% by mass, more preferably 0.05 to 40% by mass, relative to the total solid content. Such a crosslinking agent may cause a crosslinking reaction by its self-condensation. When a crosslinkable substituent is present in any of the aforementioned polymers of the present invention, such a crosslinking agent may cause a crosslinking reaction with the crosslinkable substituent.

The coating film-forming composition (resist underlayer film-forming composition) of the present invention may contain an acid generator. Examples of the acid generator include a thermal acid generator and a photoacid generator.

A photoacid generator generates an acid during exposure of the coating film-forming composition (resist underlayer film-forming composition) to light. The photoacid generator can accelerate the photocuring of a siloxane.

Examples of the thermal acid generator contained in the coating film-forming composition (resist underlayer film-forming composition) of the present invention include 2,4,4,6-tetrabromocyclohexadienone, benzoin tosylate, 2-nitrobenzyl tosylate, and other organic sulfonic acid alkyl esters.

Examples of the photoacid generator contained in the coating film-forming composition (resist underlayer film-forming composition) of the present invention include an onium salt compound, a sulfonimide compound, and a disulfonyldiazomethane compound.

Examples of the onium salt compound include iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

A single photoacid generator may be used alone, or two or more photoacid generators may be used in combination.

When the photoacid generator is used, the amount thereof is 0.01 to 5 parts by mass, or 0.1 to 3 parts by mass, or 0.5 to 1 part by mass relative to 100 parts by mass of the condensate (polyorganosiloxane).

A surfactant effectively prevents formation of, for example, pinholes and striations during application of the coating film-forming composition (resist underlayer film-forming composition) of the present invention to a substrate.

Examples of the surfactant that can be contained in the coating film-forming composition (resist underlayer film-forming composition) of the present invention include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as trade names EFTOP EF301, EF303, and EF352 (available from Tohkem Products Corporation), trade names MEGAFAC F171, F173, R-08, and R-30 (available from Dainippon Ink and Chemicals, Inc.), Fluorad FC430 and FC431 (available from Sumitomo 3M Limited), trade name Asahi Guard AG710 and trade names SURFLON S-382, SC101, SC102, SC103, SC104, SC105, and SC106 (available from Asahi Glass Co., Ltd.); and Organosiloxane Polymer KP341 (available from Shin-Etsu Chemical Co., Ltd.). These surfactants may be used alone or in combination of two or more species. When the surfactant is used, the amount thereof is 0.0001 to 5 parts by mass, or 0.001 to 1 part by mass, or 0.01 to 0.5 parts by mass relative to 100 parts by mass of the condensate (polyorganosiloxane).

No particular limitation is imposed on the solvent used in the coating film-forming composition (resist underlayer film-forming composition) of the present invention, so long as the solvent can dissolve the aforementioned solid component. Examples of such a solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methybutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more species.

Next will be described the use of the coating film-forming composition of the present invention, in particular, the use of the resist underlayer film-forming composition.

The resist underlayer film-forming composition of the present invention is applied onto a substrate used for the production of a semiconductor device (e.g., a silicon wafer substrate, a silicon/silicon dioxide-coated substrate, a silicon nitride substrate, a glass substrate, an ITO substrate, a polyimide substrate, or a substrate coated with a low dielectric constant material (low-k material)) by an appropriate application method with, for example, a spinner or a coater, followed by optional baking of the composition and then light exposure, to thereby form a resist underlayer film. The baking is performed under appropriately determined conditions; i.e., a baking temperature of 70° C. to 400° C. and a baking time of 0.3 to 60 minutes. Preferably, the baking temperature is 150° C. to 250° C., and the baking time is 10 seconds to five minutes.

A coated substrate is produced by a method including a step (i) of applying the photocurable silicon-containing coating film-forming composition to an uneven substrate, and a step (ii) of exposing the photocurable silicon-containing coating film-forming composition to light.

The step (i); i.e., application of the photocurable silicon-containing coating film-forming composition to the uneven substrate, may be followed by a step (ia) of heating the composition at a temperature of 70 to 400° C. for 10 seconds to five minutes.

The light used for the light exposure in the step (ii) has a wavelength of 150 nm to 330 nm, preferably 150 nm to 248 nm. In particular, the composition is exposed to light having a wavelength of 172 nm, to thereby cure the photocurable silicon-containing coating film.

The dose of exposure light in the step (ii) may be 10 $mJ/cm^2$ to 3,000 $mJ/cm^2$. In the step (ii), the light exposure may be performed in an inert gas atmosphere containing oxygen and/or water vapor (water). The inert gas is particularly preferably nitrogen gas.

The substrate may have an open area (non-patterned area) and a patterned area of DENSE (dense) and ISO (coarse), and the pattern may have an aspect ratio of 0.1 to 10.

The thickness of the thus-formed resist underlayer film is, for example, 10 to 1,000 nm, or 20 to 500 nm, or 50 to 300 nm, or 100 to 200 nm.

In the resist underlayer film formed through the light exposure, the difference in coating level (Bias) between the open area and the patterned area may be 1 to 50 nm.

Subsequently, for example, a photoresist layer is formed on the resist underlayer film. The photoresist layer can be formed by a well-known process; i.e., application of a photoresist composition solution onto the underlayer film, and baking of the composition. The thickness of the photoresist layer is, for example, 50 to 10,000 nm, or 100 to 2,000 nm, or 200 to 1,000 nm.

In the present invention, an organic underlayer film can be formed on a substrate, the silicon-containing resist underlayer film of the present invention can then be formed on the organic underlayer film, and then the resist underlayer film can be coated with a photoresist. This process can narrow the pattern width of the photoresist. Thus, even when the photoresist is applied thinly for preventing pattern collapse, the substrate can be processed through transfer of the resist pattern onto the underlayer film by selection of an appropriate etching gas. For example, the resist underlayer film of the present invention can be processed by using, as an etching gas, a fluorine-containing gas that achieves a significantly high etching rate for the photoresist. The organic underlayer film can be processed by using, as an etching gas, an oxygen-containing gas that achieves a significantly high etching rate for the resist underlayer film of the present invention. The substrate can be processed by using, as an etching gas, a fluorine-containing gas that achieves a significantly high etching rate for the organic underlayer film.

No particular limitation is imposed on the photoresist formed on the silicon-containing resist underlayer film of the present invention, so long as the photoresist is sensitive to light used for exposure. The photoresist may be either of negative and positive photoresists. Examples of the photoresist include a positive photoresist formed of a novolac resin and a 1,2-naphthoquinone diazide sulfonic acid ester; a chemically amplified photoresist formed of a binder having a group that decomposes with an acid to thereby increase an alkali dissolution rate and a photoacid generator; a chemically amplified photoresist formed of a low-molecular-weight compound that decomposes with an acid to thereby increase the alkali dissolution rate of the photoresist, an alkali-soluble binder, and a photoacid generator; and a chemically amplified photoresist formed of a binder having a group that decomposes with an acid to thereby increase an alkali dissolution rate, a low-molecular-weight compound that decomposes with an acid to thereby increase the alkali dissolution rate of the photoresist, and a photoacid generator. Specific examples of the photoresist include trade name APEX-E, available from Shipley, trade name PAR710, available from Sumitomo Chemical Company, Limited, and trade name SEPR430, available from Shin-Etsu Chemical Co., Ltd. Other examples of the photoresist include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Subsequently, the light exposure is performed through a predetermined mask. The light exposure may involve the use of, for example, a KrF excimer laser (wavelength: 248 nm), an ArF excimer laser (wavelength: 193 nm), and an F2 excimer laser (wavelength: 157 nm). After the light exposure, post exposure bake may optionally be performed. The post exposure bake is performed under appropriately determined conditions; i.e., a heating temperature of 70° C. to 150° C. and a heating time of 0.3 to 10 minutes.

In the present invention, a resist for electron beam lithography or a resist for EUV lithography may be used instead of the photoresist. The electron beam resist may be either of negative and positive resists. Examples of the electron beam resist include a chemically amplified resist formed of an acid generator and a binder having a group that decomposes with an acid to thereby change an alkali dissolution rate; a chemically amplified resist formed of an alkali-soluble binder, an acid generator, and a low-molecular-weight compound that decomposes with an acid to thereby change the alkali dissolution rate of the resist; a chemically amplified resist formed of an acid generator, a binder having a group that decomposes with an acid to thereby change an alkali dissolution rate, and a low-molecular-weight compound that decomposes with an acid to thereby change the alkali dissolution rate of the resist; a non-chemically amplified resist formed of a binder having a group that decomposes with electron beams to thereby change an alkali dissolution rate; and a non-chemically amplified resist formed of a binder having a moiety that is cut with electron beams to thereby change an alkali dissolution rate. Also in the case of use of such an electron beam resist, a resist pattern can be formed by using electron beams as an irradiation source in the same manner as in the case of using the photoresist.

The EUV resist may be a methacrylate resin-based resist.

Subsequently, development is performed with a developer (e.g., an alkaline developer). When, for example, a positive photoresist is used, an exposed portion of the photoresist is removed to thereby form a pattern of the photoresist.

Examples of the developer include alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine. Such a developer may also contain, for example, a surfactant. The development is performed under appropriately determined conditions; i.e., a temperature of 5 to 50° C. and a time of 10 to 600 seconds.

In the present invention, the developer may be an organic solvent. After the light exposure, the development is performed with a developer (a solvent). When, for example, a positive photoresist is used, an unexposed portion of the photoresist is removed to thereby form a pattern of the photoresist.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Such a developer may also contain, for example, a surfactant. The development is performed under appropriately determined conditions; i.e., a temperature of 5 to 50° C. and a time of 10 to 600 seconds.

The resultant patterned photoresist (upper layer) is used as a protective film for removing the resist underlayer film (intermediate layer) of the present invention. Subsequently, the patterned photoresist and the patterned resist underlayer film (intermediate layer) of the present invention are used as protective films for removing the organic underlayer film (lower layer). Finally, the patterned resist underlayer film (intermediate layer) of the present invention and the patterned organic underlayer film (lower layer) are used as protective films for processing the semiconductor substrate.

Specifically, a photoresist-removed portion of the resist underlayer film (intermediate layer) of the present invention is removed by dry etching to thereby expose the semiconductor substrate. The dry etching of the resist underlayer film of the present invention can be performed with any of gasses, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane. The dry etching of the resist underlayer film is preferably performed with a halogen-containing gas. In general, a photoresist formed of an organic substance is hard to be removed by dry etching with a halogen-containing gas. In contrast, the resist underlayer film of the present invention, which contains numerous silicon atoms, is quickly removed by dry etching with a halogen-containing gas. Therefore, a reduction in the thickness of the photoresist in association with the dry etching of the resist underlayer film can be suppressed. Thus, the photoresist can be used in the form of thin film. The dry etching of the resist underlayer film is preferably performed with a fluorine-containing gas. Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

Thereafter, the patterned photoresist and the patterned resist underlayer film of the present invention are used as protective films for removing the organic underlayer film. The dry etching of the organic underlayer film (lower layer) is preferably performed with an oxygen-containing gas, since the resist underlayer film of the present invention, which contains numerous silicon atoms, is less likely to be removed by dry etching with an oxygen-containing gas.

Finally, the semiconductor substrate is processed. The processing of the semiconductor substrate is preferably performed by dry etching with a fluorine-containing gas.

Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

An organic anti-reflective coating may be formed on the resist underlayer film of the present invention before formation of the photoresist. No particular limitation is imposed on the composition used for formation of the anti-reflective coating, and the composition may be appropriately selected from anti-reflective coating compositions that have been conventionally used in a lithographic process. The anti-reflective coating can be formed by a commonly used method, for example, application of the composition with a spinner or a coater, and baking of the composition.

The substrate to which the resist underlayer film-forming composition of the present invention is applied may have an organic or inorganic anti-reflective coating formed thereon by, for example, a CVD process. The underlayer film of the present invention may be formed on the anti-reflective coating.

The resist underlayer film formed from the resist underlayer film-forming composition of the present invention may absorb light used in a lithographic process depending on the wavelength of the light. In such a case, the resist underlayer film can function as an anti-reflective coating having the effect of preventing reflection of light from the substrate. Furthermore, the underlayer film of the present invention can be used as, for example, a layer for preventing the interaction between the substrate and the photoresist; a layer having the function of preventing the adverse effect, on the substrate, of a material used for the photoresist or a substance generated during the exposure of the photoresist to light; a layer having the function of preventing diffusion of a substance generated from the substrate during heating and baking to the photoresist serving as an upper layer; and a barrier layer for reducing a poisoning effect of a dielectric layer of the semiconductor substrate on the photoresist layer.

The resist underlayer film formed from the resist underlayer film-forming composition can be applied to a substrate having via holes for use in a dual damascene process, and can be used as an embedding material to fill up the holes. The resist underlayer film can also be used as a planarization material for planarizing the surface of a semiconductor substrate having irregularities.

The resist underlayer film can, as an EUV resist underlayer film, function not only as a hard mask, but also for the purpose described below. Specifically, the resist underlayer film-forming composition can be used for an anti-reflective EUV resist underlayer coating capable of, without intermixing with an EUV resist, preventing the reflection, from a substrate or an interface, of exposure light undesirable for EUV exposure (wavelength: 13.5 nm); for example, the aforementioned UV or DUV (ArF laser light, KrF laser light). Thus, the reflection can be efficiently prevented in the underlayer of the EUV resist. When the resist underlayer film is used as an EUV resist underlayer film, the film can be processed in the same manner as in the photoresist underlayer film.

EXAMPLES

Synthesis Example 1

A 300-ml flask was charged with 25.1 g of tetraethoxysilane (70% by mole in the entire silane), 1.71 g of phenyltrimethoxysilane (5% by mole in the entire silane), 4.60 g of methyltriethoxysilane (15% by mole in the entire silane), 4.03 g of acryloxypropyltrimethoxysilane (10% by mole in the entire silane), and 53.1 g of acetone. While the mixture was stirred with a magnetic stirrer, 11.5 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-1). The polymer was found to have a weight average molecular weight Mw of 1,800 as determined by GPC in terms of polystyrene.

Synthesis Example 2

A 300-ml flask was charged with 22.0 g of tetraethoxysilane (65% by mole in the entire silane), 1.61 g of phenyltrimethoxysilane (5% by mole in the entire silane), 12.09 g of acryloxypropyltrimethoxysilane (30% by mole in the entire silane), and 53.5 g of acetone. While the mixture was stirred with a magnetic stirrer, 10.8 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-2). The polymer was found to have a weight average molecular weight Mw of 1,800 as determined by GPC in terms of polystyrene.

Synthesis Example 3

A 300-ml flask was charged with 8.24 g of tetraethoxysilane (25% by mole in the entire silane), 1.57 g of phenyltrimethoxysilane (5% by mole in the entire silane), 25.7 g of acryloxypropyltrimethoxysilane (70% by mole in the entire silane), and 53.7 g of acetone. While the mixture was stirred with a magnetic stirrer, 10.6 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-2). The polymer was found to have a weight average molecular weight Mw of 2,000 as determined by GPC in terms of polystyrene.

Synthesis Example 4

A 300-ml flask was charged with 25.6 g of tetraethoxysilane (70% by mole in the entire silane), 1.70 g of phenyltrimethoxysilane (5% by mole in the entire silane), 4.60 g of methyltriethoxysilane (15% by mole in the entire silane), 4.06 g of glycidoxypropyltrimethoxysilane (10% by mole in the entire silane), and 53.1 g of acetone. While the mixture was stirred with a magnetic stirrer, 11.5 g of 0.01 M aqueous nitric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-3). The polymer was found to have a weight average molecular weight Mw of 1,600 as determined by GPC in terms of polystyrene.

Synthesis Example 5

A 300-ml flask was charged with 25.0 g of tetraethoxysilane (70% by mole in the entire silane), 1.70 g of phenyltrimethoxysilane (5% by mole in the entire silane), 4.58 g of methyltriethoxysilane (15% by mole in the entire silane), 4.21 g of cyclohexylepoxyethyltrimethoxysilane (10% by mole in the entire silane), and 53.2 g of acetone. While the mixture was stirred with a magnetic stirrer, 11.4 g of 0.01 M aqueous nitric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-4). The polymer was found to have a weight average molecular weight Mw of 1,600 as determined by GPC in terms of polystyrene.

Synthesis Example 6

A 300-ml flask was charged with 24.8 g of tetraethoxysilane (70% by mole in the entire silane), 1.69 g of phenyltrimethoxysilane (5% by mole in the entire silane), 4.56 g of methyltriethoxysilane (15% by mole in the entire silane), 4.37 g of norbornenetriethoxysilane (10% by mole in the entire silane), and 53.2 g of acetone. While the mixture was stirred with a magnetic stirrer, 11.4 g of 0.01 M aqueous nitric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-5). The polymer was found to have a weight average molecular weight Mw of 1,500 as determined by GPC in terms of polystyrene.

Synthesis Example 7

A 300-ml flask was charged with 25.3 g of tetraethoxysilane (70% by mole in the entire silane), 3.89 g of styryltrimethoxysilane (5% by mole in the entire silane), 6.19 g of methyltriethoxysilane (15% by mole in the entire silane), and 53.1 g of acetone. While the mixture was stirred with a magnetic stirrer, 11.6 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-6). The polymer was found to have a weight average molecular weight Mw of 1,800 as determined by GPC in terms of polystyrene.

Synthesis Example 8

A 300-ml flask was charged with 26.0 g of tetraethoxysilane (70% by mole in the entire silane), 1.77 g of phenyltrimethoxysilane (5% by mole in the entire silane), 2.65 g of vinyltrimethoxysilane (10% by mole in the entire silane), 4.78 g of methyltriethoxysilane (15% by mole in the entire silane), and 52.9 g of acetone. While the mixture was stirred with a magnetic stirrer, 11.9 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-7). The polymer was found to have a weight average molecular weight Mw of 1,800 as determined by GPC in terms of polystyrene.

Synthesis Example 9

A 300-ml flask was charged with 25.9 g of tetraethoxysilane (70% by mole in the entire silane), 1.76 g of phenyltrimethoxysilane (5% by mole in the entire silane), 2.88 g of allyltrimethoxysilane (10% by mole in the entire silane), 4.75 g of methyltriethoxysilane (15% by mole in the entire silane), and 52.9 g of acetone. While the mixture was stirred with a magnetic stirrer, 11.8 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-8). The polymer was found to have a weight average molecular weight Mw of 1,500 as determined by GPC in terms of polystyrene.

Synthesis Example 10

A 300-ml flask was charged with 26.0 g of tetraethoxysilane (70% by mole in the entire silane), 1.77 g of phenyltrimethoxysilane (5% by mole in the entire silane), 2.61 g of ethynyltrimethoxysilane (10% by mole in the entire silane), 4.78 g of methyltriethoxysilane (15% by mole in the entire silane), and 52.8 g of acetone. While the mixture was stirred with a magnetic stirrer, 11.9 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-9). The polymer was found to have a weight average molecular weight Mw of 1,500 as determined by GPC in terms of polystyrene.

Synthesis Example 11

A 300-ml flask was charged with 25.7 g of tetraethoxysilane (70% by mole in the entire silane), 1.75 g of phenyltrimethoxysilane (5% by mole in the entire silane), 3.09 g of cyanoethyltrimethoxysilane (10% by mole in the entire silane), 4.72 g of methyltriethoxysilane (15% by mole in the entire silane), and 52.9 g of acetone. While the mixture was stirred with a magnetic stirrer, 11.8 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-10). The polymer was found to have a weight average molecular weight Mw of 1,600 as determined by GPC in terms of polystyrene.

Synthesis Example 12

A 300-ml flask was charged with 25.7 g of tetraethoxysilane (70% by mole in the entire silane), 1.75 g of phenyltrimethoxysilane (5% by mole in the entire silane), 3.14 g of trimethoxysilylpropanal (10% by mole in the entire silane), 4.71 g of methyltriethoxysilane (15% by mole in the entire silane), and 53.0 g of acetone. While the mixture was stirred with a magnetic stirrer, 11.8 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-11). The polymer was found to have a weight average molecular weight Mw of 1,500 as determined by GPC in terms of polystyrene.

Synthesis Example 13

A 300-ml flask was charged with 23.3 g of tetraethoxysilane (70% by mole in the entire silane), 1.58 g of phenyltrimethoxysilane (5% by mole in the entire silane), 6.60 g of triethoxysilylpropyldiallyl isocyanurate (10% by mole in the entire silane), 4.27 g of methyltriethoxysilane (15% by mole in the entire silane), and 53.6 g of acetone. While the mixture was stirred with a magnetic stirrer, 10.6 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-12). The polymer was found to have a weight average molecular weight Mw of 1,400 as determined by GPC in terms of polystyrene.

Synthesis Example 14

A 300-ml flask was charged with 21.3 g of tetraethoxysilane (70% by mole in the entire silane), 1.49 g of phenyltrimethoxysilane (5% by mole in the entire silane), 1.51 g of dimethylpropyltrimethoxysilane (5% by mole in the entire silane), 5.21 g of methyltriethoxysilane (20% by mole in the entire silane), and 44.2 g of acetone. While the mixture was stirred with a magnetic stirrer, 26.3 g of 1 M aqueous nitric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (1). The polymer was found to have a weight average molecular weight Mw of 1,600 as determined by GPC in terms of polystyrene.

Synthesis Example 15

A 300-ml flask was charged with 24.8 g of tetraethoxysilane (70% by mole in the entire silane), 1.68 g of phenyltrimethoxysilane (5% by mole in the entire silane), 2.94 g of phenylsulfonylamidopropyltriethoxysilane (5% by mole in the entire silane), 6.06 g of methyltriethoxysilane (20% by mole in the entire silane), and 53.2 g of acetone. While the mixture was stirred with a magnetic stirrer, 11.3 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-14). The polymer was found to have a weight average molecular weight Mw of 1,600 as determined by GPC in terms of polystyrene.

Synthesis Example 16

A 300-ml flask was charged with 23.0 g of tetraethoxysilane (70% by mole in the entire silane), 4.52 g of ethoxyethoxyphenyltrimethoxysilane (10% by mole in the entire silane), 5.43 g of triethoxy((2-methoxy-4-(methoxymethyl) phenoxy)methyl)silane (10% by mole in the entire silane), 2.81 g of methyltriethoxysilane (10% by mole in the entire silane), and 53.2 g of acetone. While the mixture was stirred with a magnetic stirrer, 10.52 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether acetate was added to the mixture, and then acetone, methanol, ethanol, hydrochloric acid, and water were distilled off under reduced pressure, followed by concentration, to thereby prepare a solution of a hydrolytic condensate (polymer). Subsequently, propylene glycol monomethyl ether acetate was added to the solution so as to achieve a solvent proportion of propylene glycol monomethyl ether acetate of 100% and a solid residue content of 20% by mass at 140° C. The resultant polymer corresponds to Formula (A-15). The polymer was found to have a weight average molecular weight Mw of 1,600 as determined by GPC in terms of polystyrene.

Synthesis Example 17

A 1,000-ml flask was charged with 1.81 g of 35% by mass aqueous tetraethylammonium hydroxide solution, 2.89 g of water, 47.59 g of isopropyl alcohol, and 95.17 g of methyl isobutyl ketone. While the mixture was stirred with a magnetic stirrer, 4.27 g of phenyltrimethoxysilane (10% by mole in the entire silane), 11.51 g of methyltriethoxysilane (30% by mole in the entire silane), and 31.81 g of cyclohexylepoxyethyltrimethoxysilane (60% by mole in the entire silane) were added dropwise to the mixture.

After completion of the dropwise addition, the flask was transferred to an oil bath set at 40° C., and reaction was allowed to proceed for 240 minutes. Thereafter, 107.59 g of 1 M nitric acid was added to the reaction mixture, and the cyclohexylepoxy group was ring-opened at 40° C., to thereby prepare a hydrolytic condensate having a dihydroxyl group. Subsequently, 285.52 g of methyl isobutyl ketone and 142.76 g of water were added to the hydrolytic condensate, followed by phase separation. Reaction by-products transferred to the aqueous phase (i.e., water, nitric acid, and tetraethylammonium nitrate) were distilled off, and the organic phase was recovered. Thereafter, 142.76 g of propylene glycol monomethyl ether was added to the organic phase, and then methyl isobutyl ketone, methanol, ethanol, and water were distilled off under reduced pressure, followed by concentration, to thereby prepare a solution of a hydrolytic condensate (polymer). Subsequently, propylene glycol monoethyl ether was added to the solution so as to achieve a solvent proportion of propylene glycol monomethyl ether of 100% and a solid residue content of 20% by mass at 140° C. The resultant polymer corresponds to Formula (A-16). The polymer was found to have a weight average molecular weight Mw of 2,500 as determined by GPC in terms of polystyrene and an epoxy value of 0.

Synthesis Example 18

A 1,000-ml flask was charged with 1.61 g of 35% by mass aqueous tetraethylammonium hydroxide solution, 2.57 g of water, 46.45 g of isopropyl alcohol, and 92.90 g of methyl isobutyl ketone. While the mixture was stirred with a magnetic stirrer, 7.92 g of triethoxysilylpropyldiallyl isocyanurate (10% by mole in the entire silane), 10.24 g of methyltriethoxysilane (30% by mole in the entire silane), and 28.30 g of cyclohexylepoxyethyltrimethoxysilane (60% by mole in the entire silane) were added dropwise to the mixture. After completion of the dropwise addition, the flask was transferred to an oil bath set at 40° C., and reaction was allowed to proceed for 240 minutes. Thereafter, 95.70 g of 1 M nitric acid was added to the reaction mixture, and the cyclohexylepoxy group was ring-opened at 40° C., to thereby prepare a hydrolytic condensate having a dihydroxyl group. Subsequently, 278.69 g of methyl isobutyl ketone and 139.35 g of water were added to the hydrolytic condensate, followed by phase separation. Reaction by-products transferred to the aqueous phase (i.e., water, nitric acid, and tetraethylammonium nitrate) were distilled off, and the organic phase was recovered. Thereafter, 139.35 g of propylene glycol monomethyl ether was added to the organic phase, and then methyl isobutyl ketone, methanol, ethanol, and water were distilled off under reduced pressure, followed by concentration, to thereby prepare a solution of a hydrolytic condensate (polymer). Subsequently, propylene glycol monoethyl ether was added to the solution so as to achieve a solvent proportion of propylene glycol monomethyl ether of 100% and a solid residue content of 20% by mass at 140° C. The resultant polymer corresponds to Formula (A-17). The polymer was found to have a weight average molecular weight Mw of 2,700 as determined by GPC in terms of polystyrene and an epoxy value of 0.

Synthesis Example 19

A 1,000-ml flask was charged with 1.48 g of 35% by mass aqueous tetraethylammonium hydroxide solution, 2.36 g of water, 39.50 g of isopropyl alcohol, and 79.00 g of methyl isobutyl ketone. While the mixture was stirred with a magnetic stirrer, 7.27 g of triethoxysilylpropyldiallyl isocyanurate (11% by mole in the entire silane), 6.27 g of methyltriethoxysilane (22% by mole in the entire silane), 25.97 g of cyclohexylepoxyethyltrimethoxysilane (67% by mole in the entire silane), and 5.03 g of ethoxyethoxyphenyltrimethoxysilane were added dropwise to the mixture. After completion of the dropwise addition, the flask was transferred to an oil bath set at 40° C., and reaction was allowed to proceed for 240 minutes. Thereafter, 87.84 g of 1 M nitric acid was added to the reaction mixture, and the cyclohexylepoxy group was ring-opened at 40° C., to thereby prepare a hydrolytic condensate having a dihydroxyl group. Subsequently, 237.01 g of methyl isobutyl ketone and 118.51 g of water were added to the hydrolytic condensate, followed by phase separation. Reaction by-products transferred to the aqueous phase (i.e., water, nitric acid, and tetraethylammonium nitrate) were distilled off, and the organic phase was recovered. Thereafter, 118.51 g of propylene glycol monomethyl ether was added to the organic phase, and then methyl isobutyl ketone, methanol, ethanol, and water were distilled off under reduced pressure, followed by concentration, to thereby prepare a solution of a hydrolytic condensate (polymer). Subsequently, propylene glycol monoethyl ether was added to the solution so as to achieve a solvent proportion of propylene glycol monomethyl ether of 100% and a solid residue content of 20% by mass at 140° C. The resultant polymer corresponds to Formula (A-17). The polymer was found to have a weight average molecular weight Mw of 2,400 as determined by GPC in terms of polystyrene and an epoxy value of 0.

Synthesis Example 20

A 1,000-ml flask was charged with 1.52 g of 35% by mass aqueous tetraethylammonium hydroxide solution, 2.43 g of water, 40.55 g of isopropyl alcohol, and 81.10 g of methyl isobutyl ketone. While the mixture was stirred with a magnetic stirrer, 7.46 g of triethoxysilylpropyldiallyl isocyanurate (10% by mole in the entire silane), 6.43 g of methyltriethoxysilane (20% by mole in the entire silane), 26.66 g of cyclohexylepoxyethyltrimethoxysilane (60% by mole in the entire silane), and 4.37 g of methoxybenzyltrimethoxysilane (10% by mole in the entire silane) were added dropwise to the mixture. After completion of the dropwise addition, the flask was transferred to an oil bath set at 40° C., and reaction was allowed to proceed for 240 minutes. Thereafter, 90.17 g of 1 M nitric acid was added to the reaction mixture, and the cyclohexylepoxy group was ring-opened at 40° C., to thereby prepare a hydrolytic condensate having a dihydroxyl group. Subsequently, 243.29 g of methyl isobutyl ketone and 121.65 g of water were added to the hydrolytic condensate, followed by phase separation. Reaction by-products transferred to the aqueous phase (i.e., water, nitric acid, and tetraethylammonium nitrate) were distilled off, and the organic phase was recovered. Thereafter, 121.65 g of propylene glycol monomethyl ether was added to the organic phase, and then methyl isobutyl ketone, methanol, ethanol, and water were distilled off under reduced pressure, followed by concentration, to thereby prepare a solution of a hydrolytic condensate (polymer). Subsequently, propylene glycol monoethyl ether was added to the solution so as to achieve a solvent proportion of propylene glycol monomethyl ether of 100% and a solid residue content of 20% by mass at 140° C. The resultant polymer corresponds to Formula (A-18). The polymer was found to have a weight average molecular weight Mw of 2,600 as determined by GPC in terms of polystyrene and an epoxy value of 0.

Synthesis Example 21

A 1,000-ml flask was charged with 1.61 g of 35% by mass aqueous tetraethylammonium hydroxide solution, 2.57 g of water, 41.20 g of isopropyl alcohol, and 82.39 g of methyl isobutyl ketone. While the mixture was stirred with a magnetic stirrer, 7.92 g of triethoxysilylpropyldiallyl isocyanurate (19% by mole in the entire silane), 6.83 g of methyltriethoxysilane (18% by mole in the entire silane), 9.43 g of cyclohexylepoxyethyltrimethoxysilane (18% by mole in the entire silane), 5.48 g of ethoxyethoxyphenyltrimethoxysilane (9% by mole in the entire silane), and 17.02 g of acetoxypropyltrimethoxysilane (36% by mole in the entire silane) were added dropwise to the mixture. After completion of the dropwise addition, the flask was transferred to an oil bath set at 40° C., and reaction was allowed to proceed for 240 minutes. Thereafter, 95.71 g of 1 M nitric acid was added to the reaction mixture, and the cyclohexylepoxy group was ring-opened at 40° C., to thereby prepare a hydrolytic condensate having a dihydroxyl group. Subsequently, 247.17 g of methyl isobutyl ketone and 123.59 g of water were added to the hydrolytic condensate, followed by phase separation. Reaction by-products transferred to the aqueous phase (i.e., water, nitric acid, and tetraethylammonium nitrate) were distilled off, and the organic phase was recovered. Thereafter, 123.59 g of propylene glycol monomethyl ether was added to the organic phase, and then methyl isobutyl ketone, methanol, ethanol, and water were distilled off under reduced pressure, followed by concentration, to thereby prepare a solution of a hydrolytic condensate (polymer). Subsequently, propylene glycol monoethyl ether was added to the solution so as to achieve a solvent proportion of propylene glycol monomethyl ether of 100% and a solid residue content of 20% by mass at 140° C. The resultant polymer corresponds to Formula (A-19). The polymer was found to have a weight average molecular weight Mw of 2,800 as determined by GPC in terms of polystyrene and an epoxy value of 0.

Comparative Synthesis Example 1

A 300-ml flask was charged with 24.1 g of tetraethoxysilane (65% by mole in the entire silane), 1.8 g of phenyltrimethoxysilane (5% by mole in the entire silane), 9.5 g of triethoxymethylsilane (30% by mole in the entire silane), and 53.0 g of acetone. While the mixture was stirred with a magnetic stirrer, 11.7 g of 0.01 M aqueous hydrochloric acid solution was added dropwise to the flask. After completion of the dropwise addition, the flask was transferred to an oil bath set at 85° C., and the mixture was refluxed for 240 minutes. Thereafter, 70 g of propylene glycol monomethyl ether was added to the mixture, and then acetone, methanol, ethanol, and water were distilled off under reduced pressure, followed by concentration, to thereby prepare a solution of a hydrolytic condensate (polymer). Subsequently, propylene glycol monomethyl ether was added to the solution so as to achieve a solid residue content of 13% by mass at 140° C. The resultant polymer corresponds to the following Formula (E-1). The polymer was found to have a weight average molecular weight Mw of 1,400 as determined by GPC in terms of polystyrene.

Formula (E-1)

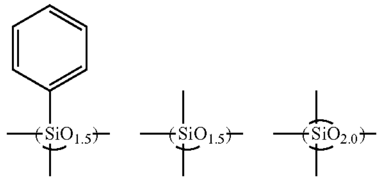

(Preparation of Composition Applied to Resist Pattern)

Each of the polysiloxanes (polymers) prepared in the aforementioned Synthesis Examples, an acid, and a solvent were mixed in proportions shown in the Tables below, and the resultant mixture was filtered with a fluororesin-made filter (0.1 μm), to thereby prepare a composition applied to a resist pattern. The amount of each polymer shown in the Tables below corresponds not to the amount of the polymer solution, but to the amount of the polymer itself.

The water used in Examples was ultrapure water. In the following Tables, the amount of each component is represented by "parts by mass." In the following Tables, MA denotes maleic acid; TPSNO3, triphenylsulfonium nitrate; TPSTf, triphenylsulfonium trifluoromethanesulfonate; TPSCl, triphenylsulfonium chloride; DPITf, diphenyliodonium trifluoromethanesulfonate; DPINf, diphenyliodonium nonafluorobutanesulfonate; TPSAdTf, triphenylsulfonium adamantanecarboxylate; TPSMale, triphenylsulfonium maleate; TPSTFA, triphenylsulfonium trifluoroacetate; PPTS, pyridinium p-toluenesulfonate; PL-LI, methoxymethylated glycoluril; and TMOM-BP, 3,3',5,5'-tetramethoxymethyl-4,4'-bisphenol available from Honshu Chemical Industry Co., Ltd.

TABLE 1

| | Si polymer solution | Additive 1 | Additive 2 | Solvent | | | |
|---|---|---|---|---|---|---|---|
| Example 1 (parts by mass) | Synthesis Example 1 2 | MA 0.06 | | PGEE 40 | PGMEA 10 | PGME 38 | Water 12 |
| Example 2 (parts by mass) | Synthesis Example 2 2 | MA 0.06 | | PGEE 40 | PGMEA 10 | PGME 38 | Water 12 |
| Example 3 (parts by mass) | Synthesis Example 3 2 | MA 0.06 | | PGEE 40 | PGMEA 10 | PGME 38 | Water 12 |
| Example 4 (parts by mass) | Synthesis Example 4 2 | MA 0.06 | | PGEE 40 | PGMEA 10 | PGME 38 | Water 12 |
| Example 5 (parts by mass) | Synthesis Example 5 2 | MA 0.06 | | PGEE 40 | PGMEA 10 | PGME 38 | Water 12 |
| Example 6 (parts by mass) | Synthesis Example 6 2 | MA 0.06 | | PGEE 40 | PGMEA 10 | PGME 38 | Water 12 |
| Example 7 (parts by mass) | Synthesis Example 7 2 | MA 0.06 | | PGEE 40 | PGMEA 10 | PGME 38 | Water 12 |
| Example 8 (parts by mass) | Synthesis Example 8 2 | MA 0.06 | | PGEE 40 | PGMEA 10 | PGME 38 | Water 12 |
| Example 9 (parts by mass) | Synthesis Example 9 2 | MA 0.06 | | PGEE 40 | PGMEA 10 | PGME 38 | Water 12 |
| Example 10 (parts by mass) | Synthesis Example 10 2 | MA 0.06 | | PGEE 40 | PGMEA 10 | PGME 38 | Water 12 |

TABLE 2

| | Si polymer solution | Additive 1 | Additive 2 | Solvent | | | |
|---|---|---|---|---|---|---|---|
| Example 11 (parts by mass) | Synthesis Example 11 2 | MA 0.06 | | PGEE 40 | PGMEA 10 | PGME 38 | Water 12 |
| Example 12 (parts by mass) | Synthesis Example 12 2 | MA 0.06 | | PGEE 40 | PGMEA 10 | PGME 38 | Water 12 |
| Example 13 (parts by mass) | Synthesis Example 13 2 | MA 0.06 | | PGEE 40 | PGMEA 10 | PGME 38 | Water 12 |
| Example 14 (parts by mass) | Synthesis Example 14 2 | MA 0.06 | | PGEE 40 | PGMEA 10 | PGME 38 | Water 12 |
| Example 15 (parts by mass) | Synthesis Example 15 2 | MA 0.06 | | PGEE 40 | PGMEA 10 | PGME 38 | Water 12 |
| Example 16 (parts by mass) | Synthesis Example 16 2 | MA 0.06 | | PGEE 40 | PGMEA 10 | PGME 38 | Water 12 |
| Example 17 (parts by mass) | Synthesis Example 17 2 | MA 0.06 | | PGEE 40 | PGMEA 10 | PGME 38 | Water 12 |
| Example 18 (parts by mass) | Synthesis Example 18 2 | MA 0.06 | | PGEE 40 | PGMEA 10 | PGME 38 | Water 12 |

TABLE 2-continued

| | Si polymer solution | Additive 1 | Additive 2 | Solvent | | | |
|---|---|---|---|---|---|---|---|
| Example 19 (parts by mass) | Synthesis Example 19 2 | MA 0.06 | | PGEE 40 | PGMEA 10 | PGME 38 | Water 12 |
| Example 20 (parts by mass) | Synthesis Example 20 2 | MA 0.06 | | PGEE 40 | PGMEA 10 | PGME 38 | Water 12 |

TABLE 3

| | Si polymer solution | Additive 1 | Additive 2 | Solvent | | | |
|---|---|---|---|---|---|---|---|
| Example 21 (parts by mass) | Synthesis Example 21 2 | MA 0.06 | | PGEE 40 | PGMEA 10 | PGME 38 | Water 12 |
| Example 22 (parts by mass) | Synthesis Example 1 2 | MA 0.06 | TPSNO3 0.06 | PGEE 40 | PGMEA 10 | PGME 38 | Water 12 |
| Example 23 (parts by mass) | Synthesis Example 2 2 | MA 0.06 | Benzoin 0.06 | PGEE 40 | PGMEA 10 | PGME 38 | Water 12 |
| Example 24 (parts by mass) | Synthesis Example 3 2 | MA 0.06 | TPSTf 0.1 | PGEE 40 | PGMEA 10 | PGME 38 | Water 12 |
| Example 25 (parts by mass) | Synthesis Example 4 2 | MA 0.06 | TPSC1 0.06 | PGEE 40 | PGMEA 10 | PGME 38 | Water 12 |
| Example 26 (parts by mass) | Synthesis Example 5 2 | MA 0.06 | Benzo-phenone 0.1 | PGEE 40 | PGMEA 10 | PGME 38 | Water 12 |
| Example 27 (parts by mass) | Synthesis Example 6 2 | MA 0.06 | DPITf 0.2 | PGEE 40 | PGMEA 10 | PGME 38 | Water 12 |
| Example 28 (parts by mass) | Synthesis Example 7 2 | MA 0.06 | DPINf 0.3 | PGEE 40 | PGMEA 10 | PGME 38 | Water 12 |
| Example 29 (parts by mass) | Synthesis Example 8 2 | MA 0.06 | TPSAdTf 0.1 | PGEE 40 | PGMEA 10 | PGME 38 | Water 12 |
| Example 30 (parts by mass) | Synthesis Example 9 2 | MA 0.06 | TPSMale 0.06 | PGEE 40 | PGMEA 10 | PGME 38 | Water 12 |

TABLE 4

| | Si polymer solution | Additive 1 | Additive 2 | Solvent | | | |
|---|---|---|---|---|---|---|---|
| Example 31 (parts by mass) | Synthesis Example 10 2 | MA 0.06 | TPSTFA 0.06 | PGEE 40 | PGMEA 10 | PGME 38 | Water 12 |
| Example 32 (parts by mass) | Synthesis Example 16 2 | MA 0.06 | TPSTf 0.1 | PGEE 40 | PGMEA 10 | PGME 38 | Water 12 |
| Example 33 (parts by mass) | Synthesis Example 16 2 | MA 0.06 | PPTS 0.1 | PGEE 40 | PGMEA 10 | PGME 38 | Water 12 |
| Example 34 (parts by mass) | Synthesis Example 17 2 | | | PGEE 40 | PGMEA 10 | PGME 50 | |
| Example 35 (parts by mass) | Synthesis Example 18 2 | PPTS 0.1 | | PGEE 40 | PGMEA 10 | PGME 50 | |
| Example 36 (parts by mass) | Synthesis Example 19 2 | TPSTf 0.1 | | PGEE 40 | PGMEA 10 | PGME 50 | |
| Example 37 (parts by mass) | Synthesis Example 20 2 | PPTS 0.1 | PL-LI 0.2 | PGEE 40 | PGMEA 10 | PGME 50 | |
| Example 38 (parts by mass) | Synthesis Example 21 2 | PPTS 0.1 | TMOM-BP 0.3 | PGEE 40 | PGMEA 10 | PGME 50 | |

TABLE 4-continued

| | Si polymer solution | Additive 1 | Additive 2 | Solvent | | |
|---|---|---|---|---|---|---|
| Comparative Example 1 (parts by mass) | Comparative Synthesis Example 1 1 | | | PGEE 40 | PGMEA 10 | PGME 50 |

(Preparation of Organic Underlayer Film)

Synthesis Example 22

Firstly, 45.22 g of propylene glycol monomethyl ether was added to 9.00 g of an epoxy group-containing benzene condensed ring compound (trade name: EPICLON HP-4700, epoxy value: 162 g/eq., available from DIC Corporation, Formula (F-1)), 9.84 g of N-(4-hydroxyphenyl) methacrylamide, 1.04 g of ethyltriphenylphosphonium bromide, and 0.02 g of hydroquinone, and the mixture was stirred in a nitrogen atmosphere under heating at 100° C. for 25 hours. To the resultant mixture were added 20 g of a cation-exchange resin (trade name: DOWEX [registered trademark] 550A, available from MUROMACHI TECHNOS CO., LTD.) and 20 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (A). The resultant compound (A) corresponds to Formula (F-2). The compound was found to have a weight average molecular weight Mw of 1,900 as determined by GPC in terms of polystyrene. No remaining epoxy group was observed.

Synthesis Example 23

Firstly, 44.77 g of propylene glycol monomethyl ether was added to 14.00 g of an epoxy group-containing benzene condensed ring compound (trade name: RE-810NM, epoxy value: 221 g/eq., available from Nippon Kayaku Co., Ltd., Formula (G-1)), 4.56 g of acrylic acid, 0.59 g of ethyltriphenylphosphonium bromide, and 0.03 g of hydroquinone, and the mixture was stirred in a nitrogen atmosphere under heating at 100° C. for 22 hours. To the resultant mixture were added 19 g of a cation-exchange resin (trade name: DOWEX [registered trademark] 550A, available from MUROMACHI TECHNOS CO., LTD.) and 19 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (B). The resultant compound (B) corresponds to Formula (G-2). The compound was found to have a weight average molecular weight Mw of 900 as determined by GPC in terms of polystyrene. No remaining epoxy group was observed.

Formula (F-1)

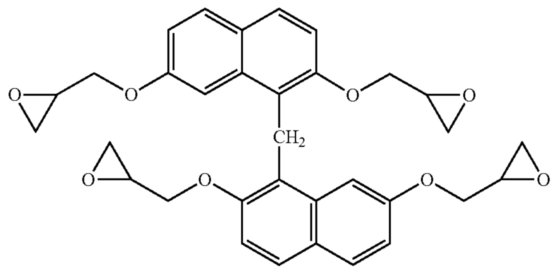

Formula (F-2)

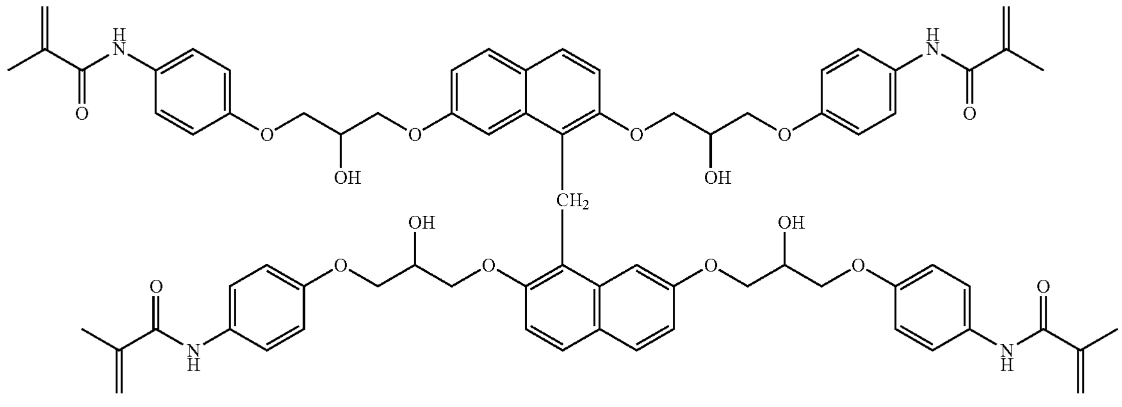

Formula (G-1)

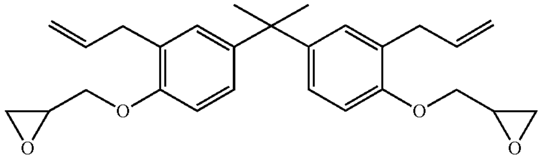

Formula (G-2)

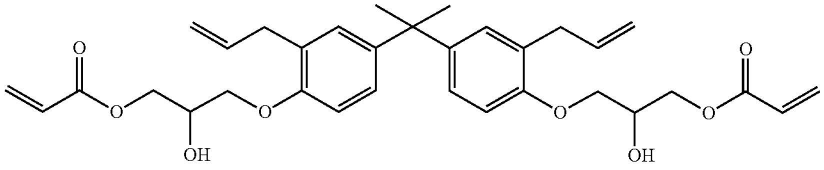

Example 39

To 2.94 g of the resin solution prepared in Synthesis Example 22 (Formula (F-2), solid content: 23.75% by mass) and 3.07 g of the resin solution prepared in Synthesis Example 23 (Formula (G-2), solid content: 22.81% by mass) were added 0.001 g of a surfactant (product name: MEGAFAC [trade name] R-40, fluorine-containing surfactant, available from DIC Corporation), 8.41 g of propylene glycol monomethyl ether, and 5.58 g of propylene glycol monomethyl ether acetate, to thereby prepare a solution of an organic underlayer film-forming composition for coating of an uneven substrate.

(Thermal Curing Property Test)

Each of the silicon-containing resist underlayer film-forming compositions prepared in Examples 1 to 38 and Comparative Example 1 was applied onto a silicon wafer with a spinner, and then heated on a hot plate at 100° C. for one minute, to thereby form a silicon-containing resist underlayer film. The organic underlayer film-forming composition prepared in Example 39 was applied onto a silicon wafer with a spinner, and then heated on a hot plate at 170° C. for one minute, to thereby form an organic underlayer film. Thereafter, a solvent of propylene glycol monomethyl ether/propylene glycol monomethyl ether acetate (=7/3) was applied onto the silicon-containing resist underlayer film or the organic underlayer film, and then spin-dried for determining a change in film thickness between before and after application of the solvent. An evaluation of "Good" was given when a change in film thickness was 10% or less, whereas an evaluation of "Not cured" was given when a change in film thickness was 10% or more.

TABLE 5

| | Solvent resistance |
|---|---|
| Example 1 | Not cured |
| Example 2 | Not cured |
| Example 3 | Not cured |
| Example 4 | Not cured |
| Example 5 | Not cured |
| Example 6 | Not cured |
| Example 7 | Not cured |
| Example 8 | Not cured |
| Example 9 | Not cured |
| Example 10 | Not cured |
| Example 11 | Not cured |
| Example 12 | Not cured |
| Example 13 | Not cured |
| Example 14 | Not cured |
| Example 15 | Not cured |

TABLE 5-continued

| | Solvent resistance |
|---|---|
| Example 16 | Not cured |
| Example 17 | Not cured |
| Example 18 | Not cured |
| Example 19 | Not cured |
| Example 20 | Not cured |

TABLE 6

| | Solvent resistance |
|---|---|
| Example 21 | Not cured |
| Example 22 | Not cured |
| Example 23 | Not cured |
| Example 24 | Not cured |
| Example 25 | Not cured |
| Example 26 | Not cured |
| Example 27 | Not cured |
| Example 28 | Not cured |
| Example 29 | Not cured |
| Example 30 | Not cured |
| Example 31 | Not cured |
| Example 32 | Not cured |
| Example 33 | Not cured |
| Example 34 | Not cured |
| Example 35 | Not cured |
| Example 36 | Not cured |
| Example 37 | Not cured |
| Example 38 | Not cured |
| Example 39 | Not cured |
| Comparative Example 1 | Not cured |

The aforementioned results demonstrated that the compositions of Examples 1 to 39 and Comparative Example 1 exhibit no thermal curing property.

[Photocuring Property Test]

Each of the silicon-containing resist underlayer film-forming compositions prepared in Examples 1 to 39 and Comparative Example 1 or the organic underlayer film-forming composition prepared in Example 39 was applied by spin coating onto a silicon wafer with a spin coater, and then heated on a hot plate at 170° C. for one minute, to thereby form a film. The entire surface of the wafer, including the silicon-containing resist underlayer film or the organic underlayer film, was irradiated with light having a wavelength of 172 nm at about 500 mJ/cm$^2$ in a nitrogen atmosphere with a 172-nm photoirradiation apparatus SUS867 available from USHIO INC. Subsequently, the uneven substrate coating film was immersed in a solvent mixture of propylene glycol monomethyl ether and propylene glycol monomethyl ether acetate (7:3) for one minute, spin-dried, and then heated at 100° C. for 30 seconds. The thickness of each of the resist underlayer film and the organic underlayer film was measured with an optical interference film thickness meter before and after immersion of the film in the solvent mixture. The results of the solvent resistance test are shown in the Tables below. In the following Tables, an evaluation of "Good" was given when a change in film thickness was 5% or less with respect to the initial thickness (i.e., the thickness before the solvent peeling test), whereas an evaluation of "Not cured" was given when a change in film thickness was 5% or more.

TABLE 7

| | Solvent resistance |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |
| Example 13 | Good |
| Example 14 | Good |
| Example 15 | Good |
| Example 16 | Good |
| Example 17 | Good |
| Example 18 | Good |
| Example 19 | Good |
| Example 20 | Good |

TABLE 8

| | Solvent resistance |
|---|---|
| Example 21 | Good |
| Example 22 | Good |
| Example 23 | Good |
| Example 24 | Good |
| Example 25 | Good |
| Example 26 | Good |
| Example 27 | Good |
| Example 28 | Good |
| Example 29 | Good |
| Example 30 | Good |
| Example 31 | Good |
| Example 32 | Good |
| Example 33 | Good |
| Example 34 | Good |
| Example 35 | Good |
| Example 36 | Good |
| Example 37 | Good |
| Example 38 | Good |
| Example 39 | Good |
| Comparative Example 1 | Not cured |

The aforementioned results demonstrated that the compositions of Examples 1 to 39 exhibit photocuring property.

[Measurement of Optical Constant]

Each of the silicon-containing resist underlayer film-forming compositions prepared in Examples 5 and 35 or the organic underlayer film-forming composition prepared in Example 39 was applied onto a silicon wafer with a spin coater, and then baked on a hot plate at 100° C. (Example 5 or 35) or 170° C. (Example 39) for one minute, to thereby form a coating film having a thickness of 50 nm. The resultant silicon-containing resist underlayer film or the organic underlayer film was treated in the same manner as in the photocuring property test (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.), to thereby prepare samples before and after the photoirradiation. The refractive index (n-value) and optical absorption coefficient (k-value, also called extinction coefficient) of each sample were measured at a wavelength of 193 nm with a spectroscopic ellipsometer.

TABLE 9

| Example | n/k 193 nm Before photoirradiation | n/k 193 nm After photoirradiation |
|---|---|---|
| Example 5 | 1.65/0.13 | 1.56/0.05 |
| Example 35 | 1.74/0.21 | 1.68/0.18 |
| Example 39 | 1.51/0.48 | 1.51/0.39 |

(Test for Planarity on Uneven Substrate)

For evaluation of coating of an uneven substrate, the thicknesses of portions of a coating film were compared on a silicon uneven substrate; specifically, an $SiO_2$-deposited uneven substrate having a trench width of 800 nm and a height of 200 nm.

The organic underlayer film-forming composition prepared in Example 39 was applied onto the aforementioned substrate to achieve a coating thickness of 150 nm and then heated at 170° C. for one minute. Subsequently, the resultant film was photocured in the same manner as described above (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.). Thereafter, each of the silicon-containing resist underlayer film-forming compositions of Examples 1 to 38 was applied by spin coating onto the film and baked under different baking conditions, and then the resultant silicon-containing resist underlayer film was photocured in the same manner as described above (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.) (Examples 1-1 to 38).

In Comparative Example 2, the organic underlayer film-forming composition prepared in Example 39 was applied onto the aforementioned substrate to achieve a coating thickness of 150 nm and then heated at 170° C. for one minute. Subsequently, the resultant film was photocured in the same manner as in the photocuring property test (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.). Thereafter, the resist underlayer film-forming composition of Example 5 was applied by spin coating onto the film and baked at 215° C. for one minute, to thereby form a coating film (40 nm) without photocuring (Comparative Example 2).

A cross section of the resultant sample was observed with a scanning electron microscope (S-4800) available from Hitachi High-Technologies Corporation, to thereby measure the difference in thickness between a trench area (groove portion) and a non-trench area (open area: non-groove portion) of the upper portion of the organic underlayer film at the interface between the organic underlayer film and the silicon-containing resist underlayer film. An evaluation of "Good" was given when the difference in thickness was 10 nm or less, whereas an evaluation of "Poor" was given when the difference in thickness was 10 nm or more.

TABLE 10

| Example | Silicon-containing resist underlayer film Baking conditions | Difference in thickness (nm) |
|---|---|---|
| Example 1-1 | No baking | Good |
| Example 1-2 | 100 °C/60 seconds | Good |
| Example 1-3 | 130 °C/60 seconds | Good |
| Example 2 | 100 °C/60 seconds | Good |
| Example 3 | 100 °C/60 seconds | Good |
| Example 4 | 100 °C/60 seconds | Good |
| Example 5 | 100 °C/60 seconds | Good |
| Example 6 | 100 °C/60 seconds | Good |
| Example 7 | 100 °C/60 seconds | Good |
| Example 8 | 100 °C/60 seconds | Good |
| Example 9 | 100 °C/60 seconds | Good |
| Example 10 | 100 °C/60 seconds | Good |
| Example 11 | 100 °C/60 seconds | Good |
| Example 12 | 100 °C/60 seconds | Good |
| Example 13 | 100 °C/60 seconds | Good |
| Example 14 | 100 °C/60 seconds | Good |
| Example 15 | 100 °C/60 seconds | Good |
| Example 16 | 100 °C/60 seconds | Good |
| Example 17 | 100 °C/60 seconds | Good |
| Example 18 | 100 °C/60 seconds | Good |
| Example 19 | 100 °C/60 seconds | Good |
| Example 20 | 100 °C/60 seconds | Good |

TABLE 11

| Example | Silicon-containing resist underlayer film Baking conditions | Difference in thickness (nm) |
|---|---|---|
| Example 21 | 100 °C/60 seconds | Good |
| Example 22 | 100 °C/60 seconds | Good |
| Example 23 | 100 °C/60 seconds | Good |
| Example 24 | 100 °C/60 seconds | Good |
| Example 25 | 100 °C/60 seconds | Good |
| Example 26 | 100 °C/60 seconds | Good |
| Example 27 | 100 °C/60 seconds | Good |
| Example 28 | 100 °C/60 seconds | Good |
| Example 29 | 100 °C/60 seconds | Good |
| Example 30 | 100 °C/60 seconds | Good |
| Example 31 | 100 °C/60 seconds | Good |
| Example 32 | 100 °C/60 seconds | Good |
| Example 33 | 100 °C/60 seconds | Good |
| Example 34 | 100 °C/60 seconds | Good |
| Example 35 | 100 °C/60 seconds | Good |
| Example 36 | 100 °C/60 seconds | Good |
| Example 37 | 100 °C/60 seconds | Good |
| Example 38 | 100 °C/60 seconds | Good |
| Comparative Example 2 | 215 °C/60 seconds | Poor (60 nm) |

The aforementioned results demonstrated that the planarity can be drastically improved by using a photocurable silicon material, rather than a conventionally used thermally curable silicon material.

(Filling Test on Uneven Substrate)

Fillability was evaluated on a silicon uneven substrate; specifically, an $SiO_2$-deposited uneven substrate having a trench width of 50 nm, a pitch of 100 nm, and a height of 200 nm.

The organic underlayer film-forming composition prepared in Example 39 was applied onto the aforementioned substrate to achieve a coating thickness of 150 nm and then heated at 170° C. for one minute. Subsequently, the resultant film was photocured in the same manner as described above (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.). Thereafter, each of the silicon-containing resist underlayer film-forming compositions of Examples 1 to 38 was applied by spin coating onto the film and baked under different baking conditions, and then the resultant silicon-containing resist underlayer film was photocured in the same manner as described above (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.) (Examples 1-1 to 38).

In Comparative Example 3, the organic underlayer film-forming composition prepared in Example 39 was applied onto the aforementioned substrate to achieve a coating thickness of 150 nm and then heated at 170° C. for one minute. Subsequently, the resultant film was photocured in the same manner as in the photocuring property test (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.). Thereafter, the resist underlayer film-forming composition of Example 5 was applied by spin coating onto the film and baked at 215° C. for one minute, to thereby form a coating film (40 nm) without photocuring (Comparative Example 3).

A cross section of the resultant sample was observed with a scanning electron microscope (S-4800) available from Hitachi High-Technologies Corporation, to thereby evaluate fillability. An evaluation of "Good" was given in the case of filling without occurrence of voids, whereas an evaluation of "Poor" was given in the case of occurrence of voids.

TABLE 12

| Example | Silicon-containing resist underlayer film Baking conditions | Fillability |
|---|---|---|
| Example 1-1 | No baking | Good |
| Example 1-2 | 100 °C/60 seconds | Good |
| Example 1-3 | 130 °C/60 seconds | Good |
| Example 2 | 100 °C/60 seconds | Good |
| Example 3 | 100 °C/60 seconds | Good |
| Example 4 | 100 °C/60 seconds | Good |
| Example 5 | 100 °C/60 seconds | Good |
| Example 6 | 100 °C/60 seconds | Good |
| Example 7 | 100 °C/60 seconds | Good |
| Example 8 | 100 °C/60 seconds | Good |
| Example 9 | 100 °C/60 seconds | Good |
| Example 10 | 100 °C/60 seconds | Good |
| Example 11 | 100 °C/60 seconds | Good |
| Example 12 | 100 °C/60 seconds | Good |
| Example 13 | 100 °C/60 seconds | Good |
| Example 14 | 100 °C/60 seconds | Good |
| Example 15 | 100 °C/60 seconds | Good |
| Example 16 | 100 °C/60 seconds | Good |
| Example 17 | 100 °C/60 seconds | Good |
| Example 18 | 100 °C/60 seconds | Good |
| Example 19 | 100 °C/60 seconds | Good |
| Example 20 | 100 °C/60 seconds | Good |

TABLE 13

| Example | Silicon-containing resist underlayer film Baking conditions | Fillability |
|---|---|---|
| Example 21 | 100 °C/60 seconds | Good |
| Example 22 | 100 °C/60 seconds | Good |
| Example 23 | 100 °C/60 seconds | Good |

TABLE 13-continued

| Example | Silicon-containing resist underlayer film Baking conditions | Fillability |
|---|---|---|
| Example 24 | 100 °C/60 seconds | Good |
| Example 25 | 100 °C/60 seconds | Good |
| Example 26 | 100 °C/60 seconds | Good |
| Example 27 | 100 °C/60 seconds | Good |
| Example 28 | 100 °C/60 seconds | Good |
| Example 29 | 100 °C/60 seconds | Good |
| Example 30 | 100 °C/60 seconds | Good |
| Example 31 | 100 °C/60 seconds | Good |
| Example 32 | 100 °C/60 seconds | Good |
| Example 33 | 100 °C/60 seconds | Good |
| Example 34 | 100 °C/60 seconds | Good |
| Example 35 | 100 °C/60 seconds | Good |
| Example 36 | 100 °C/60 seconds | Good |
| Example 37 | 100 °C/60 seconds | Good |
| Example 38 | 100 °C/60 seconds | Good |
| Comparative Example 3 | 215 °C/60 seconds | Good |

The aforementioned results demonstrated that good fillability can be maintained in the case of use of the photocurable silicon-containing resist underlayer film, similar to the case of use of the thermally curable silicon-containing resist underlayer film.

[Evaluation of Resist Pattern by ArF Exposure: Alkaline Development of Resist (PTD)]

(Evaluation of Resist Patterning: Evaluation Through PTD Process Involving Alkaline Development)

The organic underlayer film-forming composition prepared in Example 39 was applied onto the aforementioned substrate to achieve a coating thickness of 200 nm and then heated at 170° C. for one minute. Subsequently, the resultant film was photocured in the same manner as in the photocuring property test (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.) (layer A). Thereafter, each of the silicon-containing resist underlayer film-forming compositions of Examples 1 to 38 and Comparative Example 1 was applied by spin coating onto the layer A and baked at 100° C. for 60 seconds, and then the resultant silicon-containing resist underlayer film was photocured in the same manner as described above (i.e., irradiation of the entire surface of the wafer with light having a wavelength of 172 nm at about 500 mJ/cm$^2$ in a nitrogen atmosphere with a 172-nm photoirradiation apparatus SUS867 available from USHIO INC.) (layer B). The photocured silicon-containing resist underlayer film had a thickness of 40 nm.

A commercially available resist solution for ArF (trade name: AR2772JN, available from JSR Corporation) was applied onto the photocured silicon-containing resist underlayer film with a spinner, and then heated on a hot plate at 110° C. for one minute, to thereby form a photoresist film (layer C) having a thickness of 120 nm.

By using a scanner NSR-S307E available from Nikon Corporation (wavelength: 193 nm, NA, σ: 0.85, 0.93/0.85), the photoresist film was exposed to light through a mask designed to achieve a line width of 0.062 μm and an interline width of 0.062 μm (i.e., a 0.062 μm line and space (L/S)=1/1 dense line) in the photoresist after development. Thereafter, the photoresist film was baked on a hot plate at 100° C. for 60 seconds and then cooled, followed by development with a 2.38% alkaline aqueous solution for 60 seconds, to thereby form a positive pattern on the resist underlayer film (layer B). The resultant photoresist pattern was evaluated as "Good" when it did not undergo large pattern peeling, undercut, or a wide-bottomed line (footing). Meanwhile, the photoresist pattern was evaluated as "Poor" when it underwent large pattern peeling, undercut, or a wide-bottomed line (footing).

TABLE 14

| | Photoresist pattern shape |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |
| Example 13 | Good |
| Example 14 | Good |
| Example 15 | Good |
| Example 16 | Good |
| Example 17 | Good |
| Example 18 | Good |
| Example 19 | Good |
| Example 20 | Good |

TABLE 15

| | Photoresist pattern shape |
|---|---|
| Example 21 | Good |
| Example 22 | Good |
| Example 23 | Good |
| Example 24 | Good |
| Example 25 | Good |
| Example 26 | Good |
| Example 27 | Good |
| Example 28 | Good |
| Example 29 | Good |
| Example 30 | Good |
| Example 31 | Good |
| Example 32 | Good |
| Example 33 | Good |
| Example 34 | Good |
| Example 35 | Good |
| Example 36 | Good |
| Example 37 | Good |
| Example 38 | Good |
| Example 39 | Good |
| Comparative Example 1 | Poor |

INDUSTRIAL APPLICABILITY

The present invention involves the use of a photocurable silicon-containing coating film-forming composition. Thus, since a silicon-containing coating film is photocured without the need for curing (baking) at high temperature in a lithographic process of an uneven substrate, the planarity of a photocured organic underlayer film present below the coating film is not deteriorated. Therefore, formation of a resist film on the high-planarity silicon-containing coating film formed on the high-planarity organic underlayer film can effectively prevent diffused reflection at the layer interface, and occurrence of unevenness after etching, to thereby produce a semiconductor device having a fine rectangular resist pattern.

The invention claimed is:

1. A method for producing a semiconductor device, the method comprising:

a step of forming, on an uneven substrate, a resist underlayer film from a photocurable silicon-containing coating film-forming composition;

wherein the step of forming the resist underlayer film comprises:

a step (i) of applying the photocurable silicon-containing coating film-forming composition to the uneven substrate; and a step (ii) of exposing the photocurable silicon-containing coating film-forming composition to light or electron beams, the light having a wavelength of 150 nm to 330 nm and an exposure dose of 10 $mJ/cm^2$ to 3,000 $mJ/cm^2$;

a step of forming a resist film on the resist underlayer film; and developing the resist film, to thereby form a resist pattern;

a step of etching the resist underlayer film with the resist pattern; and a step of processing a semiconductor substrate with the patterned resist underlayer film, wherein the photocurable silicon-containing coating film-forming composition comprises a hydrolyzable silane, a hydrolysate thereof, or a hydrolytic condensate thereof, wherein the hydrolyzable silane is a hydrolyzable silane of the following Formula (1):

$$R^1_aR^2_bSi(R^3)_{4-(a+b)} \qquad \text{Formula (1)}$$

wherein $R^1$ is (1) an organic group having a multiple bond between a carbon atom and a carbon atom, an oxygen atom, or a nitrogen atom, (2) an epoxide-containing organic group, (3) a sulfur-containing organic group, (4) an organic group containing an amide group, a primary to tertiary amino group, or a primary to tertiary ammonium group, or (5) a phenoplast-forming group containing a phenolic-group-containing organic group or a phenolic-group-generating organic group and a methylol-group-containing organic group or a methylol-group-generating organic group, or an organic group containing any combination of these groups, and is bonded to a silicon atom via an Si—C bond; $R^2$ is an alkyl group and is bonded to a silicon atom via an Si—C bond; $R^3$ is an alkoxy group, an acyloxy group, or a halogen group; a is an integer of 1; b is an integer of 0 to 2; and a+b is an integer of 1 to 3, wherein the uneven substrate has an open area which is a non-patterned area, a DENSE area which is a patterned region in which a spacing between adjacent pattern features is smaller than that in an ISO area, and an ISO area which is a patterned area in which a spacing between adjacent pattern features is larger than that in the DENSE area, and the pattern has an aspect ratio of 0.1 to 10.

2. A method for producing a semiconductor device, the method comprising:

a step of forming, on an uneven substrate, a resist underlayer film from a photocurable silicon-containing coating film-forming composition comprising a hydrolyzable silane, a hydrolysate thereof, or a hydrolytic condensate thereof, wherein the hydrolyzable silane is a hydrolyzable silane of the following Formula (1):

$$R^1_aR^2_bSi(R^3)_{4-(a+b)} \qquad \text{Formula (1)}$$

wherein $R^1$ is (1) an organic group having a multiple bond between a carbon atom and a carbon atom, an oxygen atom, or a nitrogen atom, (2) an epoxide-containing organic group, (3) a sulfur-containing organic group, (4) an organic group containing an amide group, a primary to tertiary amino group, or a primary to tertiary ammonium group, or (5) a phenoplast-forming group containing a phenolic-group-containing organic group or a phenolic-group-generating organic group and a methylol-group-containing organic group or a methylol-group-generating organic group, or an organic group containing any combination of these groups, and is bonded to a silicon atom via an Si—C bond; $R^2$ is an alkyl group and is bonded to a silicon atom via an Si—C bond; $R^3$ is an alkoxy group, an acyloxy group, or a halogen group; a is an integer of 1; b is an integer of 0 to 2; and a+b is an integer of 1 to 3;

a step of forming the resist underlayer film comprising a step (i) of applying a photocurable silicon-containing coating film-forming composition to an uneven substrate;

a step (ii) of exposing the photocurable silicon-containing coating film-forming composition to light, the light having a wavelength of 150 nm to 330 nm and an exposure dose of 10 $mJ/cm^2$ to 3,000 $mJ/cm^2$;

a step of forming a resist film on the resist underlayer film;

a step of irradiating the resist film with light or electron beams and developing the resist film, to thereby form a resist pattern;

a step of etching the resist underlayer film with the resist pattern; and a step of processing a semiconductor substrate with the patterned resist underlayer film, wherein the uneven substrate has an open area which is a non-patterned area, a DENSE area which is a patterned region in which a spacing between adjacent pattern features is smaller than that in an ISO area, and an ISO area which is a patterned area in which a spacing between adjacent pattern features is larger than that in the DENSE area, and the pattern has an aspect ratio of 0.1 to 10.

3. A method for producing a semiconductor device, the method comprising:

a step of forming, on an uneven substrate, a resist underlayer film from a photocurable silicon-containing coating film-forming composition;

wherein the step of forming the resist underlayer film comprises:

a step (i) of applying the photocurable silicon-containing coating film-forming composition to the uneven substrate; and a step (ii) of exposing the photocurable silicon-containing coating film-forming composition to light or electron beams, the light having a wavelength of 150 nm to 330 nm and an exposure dose of 10 $mJ/cm^2$ to 3,000 $mJ/cm^2$;

a step of forming a resist film on the resist underlayer film; and developing the resist film, to thereby form a resist pattern;

a step of etching the resist underlayer film with the resist pattern; and a step of processing a semiconductor substrate with the patterned resist underlayer film, wherein the photocurable silicon-containing coating film-forming composition comprises a hydrolyzable silane, a hydrolysate thereof, or a hydrolytic condensate thereof, wherein the hydrolyzable silane is a hydrolyzable silane of the following Formula (1):

$$R^1_a R^2_b Si(R^3)_{4-(a+b)} \qquad \text{Formula (1)}$$

wherein $R^1$ is (1) an organic group having a multiple bond between a carbon atom and a carbon atom, an oxygen atom, or a nitrogen atom, (2) an epoxide-containing organic group, (3) a sulfur-containing organic group, (4) an organic group containing an amide group, a primary to tertiary amino group, or a primary to tertiary ammonium group, or (5) a phenoplast-forming group containing a phenolic-group-containing organic group or a phenolic-group-generating organic group and a methylol-group-containing organic group or a methylol-group-generating organic group, or an organic group containing any combination of these groups, and is bonded to a silicon atom via an Si—C bond; $R^2$ is an alkyl group and is bonded to a silicon atom via an Si—C bond; $R^3$ is an alkoxy group, an acyloxy group, or a halogen group; a is an integer of 1; b is an integer of 0 to 2; and a+b is an integer of 1 to 3, wherein the uneven substrate has an open area which is a non-patterned area, a DENSE area which is a patterned region in which a spacing between adjacent pattern features is smaller than that in an ISO area, and an ISO area which is a patterned area in which a spacing between adjacent pattern features is larger than that in the DENSE area, and wherein the resist underlayer film formed from the photocurable silicon-containing coating film-forming composition has the difference in coating level (Bias) between the open area and the patterned area is 1 to 50 nm.

* * * * *